US009236879B2

(12) United States Patent
Kawahito

(10) Patent No.: US 9,236,879 B2
(45) Date of Patent: Jan. 12, 2016

(54) A/D CONVERTER, IMAGE SENSOR DEVICE, AND METHOD OF GENERATING DIGITAL SIGNAL FROM ANALOG SIGNAL

(75) Inventor: Shoji Kawahito, Hamamatsu (JP)

(73) Assignee: NATIONAL UNIVERSITY CORPORATION SHIZUOKA UNIVERSITY (JP)

( * ) Notice: Subject to any disclaimer, the term of this patent is extended or adjusted under 35 U.S.C. 154(b) by 215 days.

(21) Appl. No.: 13/985,723

(22) PCT Filed: Feb. 17, 2012

(86) PCT No.: PCT/JP2012/053868
§ 371 (c)(1),
(2), (4) Date: Sep. 27, 2013

(87) PCT Pub. No.: WO2012/111821
PCT Pub. Date: Aug. 23, 2012

(65) Prior Publication Data
US 2014/0014821 A1   Jan. 16, 2014

(30) Foreign Application Priority Data

Feb. 18, 2011   (JP) ................................. 2011-033718

(51) Int. Cl.
| H03M 1/12 | (2006.01) |
| H03M 1/18 | (2006.01) |
| H04N 5/378 | (2011.01) |
| H03M 1/16 | (2006.01) |
| H03M 1/40 | (2006.01) |
| H03M 1/56 | (2006.01) |

(52) U.S. Cl.
CPC ............... *H03M 1/18* (2013.01); *H03M 1/162* (2013.01); *H04N 5/378* (2013.01); *H03M 1/403* (2013.01); *H03M 1/56* (2013.01)

(58) Field of Classification Search
CPC .......................... H03M 1/0602; H03M 1/0604
USPC ................................ 250/208.1; 341/155, 172
See application file for complete search history.

(56) References Cited

U.S. PATENT DOCUMENTS

2010/0182176 A1*   7/2010   Kawahito ...................... 341/122

FOREIGN PATENT DOCUMENTS

| JP | 2004-096636 | 3/2004 |
| WO | WO 2008/016049 | 2/2008 |

OTHER PUBLICATIONS

PCT/IB/338 Notification of Transmittal of Translation of the International Preliminary Report on Patentability including PCT/IB/373 and PCT ISA/237 in English dated Aug. 23, 2013 (6 pages).

*Primary Examiner* — Thanh Luu
(74) *Attorney, Agent, or Firm* — Ostrolenk Faber LLP

(57) ABSTRACT

According to this A/D converter, a first A/D conversion operation for performing integral A/D conversion and a second A/D conversion operation for performing cyclic A/D conversion are realized based on control of operational procedures in a same circuit configuration. Moreover, in the first A/D conversion operation, since a capacity of a capacitor used in the integration of an output signal is greater than a capacity of a capacitor used for storing an input analog signal and a standard reference voltage, the analog signal that is input in the integral A/D conversion is attenuated according to the capacity ratio and subject to sampling and integration. Consequently, the voltage range of the analog signal that is output in the integral A/D conversion also decreases according to the capacity ratio of the capacitors, and the A/D converter can be therefore constructed with a single-ended configuration.

11 Claims, 16 Drawing Sheets

(a)

(b)

(c)

(d)

(a)

(b)

(a)

(b)

(a)

(b)

(c)

(a)

(a) $V_{RI}=V_{RH}$ (b)

(b) $V_{RI}=V_{RL}$ (a)

(b)

(c)

(d)

A/D CONVERTER, IMAGE SENSOR DEVICE, AND METHOD OF GENERATING DIGITAL SIGNAL FROM ANALOG SIGNAL

CROSS-REFERENCE TO RELATED APPLICATIONS

The present application is a 35 U.S.C. §§371 national phase conversion of PCT/JP2012/053868, filed Feb. 17, 2012, which claims priority to Japanese Patent Application No. 2011-033718, filed Feb. 18, 2011, the contents of both of which are incorporated herein by reference. The PCT International Application was published in the Japanese language.

TECHNICAL FIELD

The present invention relates to an A/D converter, an image sensor device, and a method of generating a digital signal from an analog signal.

BACKGROUND ART

Patent Literature 1 describes an A/D converter. With this A/D converter, integral (or folding integral) A/D conversion is performed to an input analog signal, and cyclic A/D conversion is performed to a residual analog signal of the folding integral A/D conversion. In the folding integral A/D conversion, operation for A/D conversion is performed while repeating the sampling of the input signal and the integration of the sampled values, and a digital value is thereby obtained from an analog signal. With this method of A/D conversion, since the dynamic range can be expanded based on the folding operation while reducing the noise based on integration, it is possible to satisfy both low noise and dynamic range.

CITATION LIST

Patent Literature

Patent Literature 1: WO 2008/016049

SUMMARY OF INVENTION

Technical Problem

With the folding integral A/D converter described in Patent Literature 1, for instance, when the voltage range of the input signal is 0 to 1 V, the output range will be double at −1 V to 1 V. In the foregoing case, if the cyclic A/D conversion to be performed after the folding integral A/D conversion is configured from an entire differential cyclic A/D converter, it is possible to accommodate an input voltage range that is double the input voltage range in the folding integration while using the same reference voltage. Nevertheless, if the cyclic A/D converter is configured from a single-ended A/D converter, there is a problem in that it is only possible to accommodate an input voltage range that is ½ of the entire differential. In other words, if a single-ended A/D converter is applied to the A/D converter described in Patent Literature 1, the amplitude range of the input voltage will be limited to half. Meanwhile, there were demands for this A/D converter to adopt a single-ended configuration for downsizing and achieving lower power consumption.

Thus, and object of this invention is to realize, with a single-ended configuration, an A/D converter which performs A/D conversion based on folding integration and cyclic A/D conversion of a residual analog signal thereof.

Solution to Problem

One aspect of the present invention is a single-ended A/D converter. This A/D converter comprises a gain stage which includes an input for receiving an analog signal to be converted into a digital value, an output, and an operational amplifier circuit having a first input, a second input and an output, an A/D conversion circuit which refers to a conversion reference voltage and generates a digital signal including one or more bits based on a signal from the output of the gain stage, a logical circuit which generates a control signal according to the digital signal, and a D/A conversion circuit which has first and second outputs, and provides at least a first standard reference voltage or a second standard reference voltage to the gain stage via the first and second outputs in accordance with the control signal, wherein the gain stage includes first to third capacitors, a capacity of the third capacitor is greater than capacities of the first and second capacitors, the second input of the operational amplifier circuit receives a reference potential, the first standard reference voltage is higher than the second standard reference voltage value, the D/A conversion circuit includes a switch circuit for providing either the first or second standard reference voltage to the first output and providing either the first or second standard reference voltage to the second output in response to the control signal, the A/D converter performs a first A/D conversion operation and a second A/D conversion operation, in the first A/D conversion operation, the gain stage performs a first arithmetic operation of generating an operation value with the operational amplifier circuit and the first to third capacitors, and a first storage operation, in the first storage operation, the first capacitor stores a first or second standard reference voltage supplied from the first output, or the analog signal, the second capacitor stores a first or second standard reference voltage supplied from the second output, the third capacitor is connected between the output and the first input of the operational amplifier circuit, in the first arithmetic operation, when the first or second standard reference voltage is stored in the first capacitor in the first storage operation, the first capacitor is connected between the input to receive the analog signal and the first input, and when the analog signal is stored in the first capacitor in the first storage operation, the first capacitor is connected between the first output and the first input, the second capacitor is connected between the second output and the first input, the operation value is generated in the output of the gain stage by the third capacitor being connected between the output and the first input of the operational amplifier circuit, in the second A/D conversion operation, the gain stage performs a second arithmetic operation of generating an operation value with the operational amplifier circuit and the first to third capacitors, and a second storage operation of storing the operation value in the first and second capacitors, and in the second arithmetic operation, the operation value is generated in the output of the gain stage by the third capacitor being connected between the output and the first input of the operational amplifier circuit, and the first and second capacitors being respectively connected between the first or second output and the first input of the D/A conversion circuit.

According to this A/D converter, by performing control of operational procedures in a same circuit configuration, a first A/D conversion operation for performing a folding integral A/D conversion and a second A/D conversion operation for performing a cyclic A/D conversion are realized. Moreover, in the first A/D conversion operation, since the capacity of the third capacitor used in the integration of an output signal is greater than the capacity of the first and second capacitors used for storing the analog signal and the standard reference voltage to be subject to A/D conversion, the analog signal that is input in the folding integral A/D conversion is attenuated according to the capacity ratio and subject to sampling and integration. Consequently, the voltage range of the analog signal that is output in the folding integral A/D conversion also decreases according to the capacity ratio of the capacitors, and the A/D converter can be therefore constructed with a single-ended configuration.

With the A/D converter according to the present invention, the third capacitor has a capacity that is double the capacity of the first or second capacitor.

According to this A/D converter, the analog signal that is input in the folding integral A/D conversion is attenuated to ½ and subject to sampling and integration. Consequently, since the voltage range of the analog signal that is output in the folding integral A/D conversion also becomes ½ in accordance with the capacity ratio of the capacitors, an input voltage that is suitable for a single-ended A/D converter is provided in the cyclic A/D conversion.

With the A/D converter according to the present invention, the conversion reference voltage is a median between the first standard reference voltage and the second standard reference voltage value, the A/D conversion circuit generates a 1-bit digital signal, and the logical circuit generates a control signal having first and second values.

According to this A/D converter, since a digital signal is generated based on one conversion reference voltage that was appropriately set, the A/D conversion circuit can be configured simply, and the circuit to receive the generated digital signal can also adopt a simple configuration.

With the A/D converter according to the present invention, a first conversion reference voltage $V_{RC2H}$ and a second conversion reference voltage $V_{RC2L}$ in the second A/D conversion operation are respectively expressed by the following formulae:

$$V_{RC2H}=(5\ V_{RH}+3\ V_{RL})/8;\text{ and}$$

$$V_{RC2L}=(3\ V_{RH}+5\ V_{RL})/8.$$

According to this A/D converter, the second A/D conversion operation is performed appropriately.

With the A/D converter according to the present invention, the A/D conversion circuit includes first and second conversion reference voltages, the first conversion reference voltage is higher than a median between the first standard reference voltage and the second standard reference voltage value and lower than the first standard reference voltage, the first conversion reference voltage in the first A/D conversion operation is higher than the first conversion reference voltage in the second A/D conversion operation, the second conversion reference voltage is lower than the median and higher than the second standard reference voltage, the second conversion reference voltage in the first A/D conversion operation is lower than the second conversion reference voltage in the second A/D conversion operation, the A/D conversion circuit generates a ternary digital signal, and the logical circuit generates a control signal including first to third values.

According to this A/D converter, since the conversion reference voltage is set to an appropriate voltage, the first A/D conversion operation and the second A/D conversion operation are performed appropriately.

With the A/D converter according to the present invention, when the first standard reference voltage is represented by $V_{RH}$ and the second standard reference voltage is represented by $V_{RL}$, the first conversion reference voltage $V_{RC1H}$ and the second conversion reference voltage $V_{RC1L}$ in the first A/D conversion operation are respectively expressed by the following formulae:

$$V_{RC1H}=(3\ V_{RH}+V_{RL})/4;\text{ and}$$

$$V_{RC1L}=(V_{RH}+3\ V_{RL})/4,\text{ and}$$

the first conversion reference voltage $V_{RC2H}$ and the second conversion reference voltage $V_{RC2L}$ in the second A/D conversion operation are respectively expressed by the following formulae:

$$V_{RC2H}=(5\ V_{RH}+3\ V_{RL})/8;\text{ and}$$

$$V_{RC2L}=(3\ V_{RH}+5\ V_{RL})/8.$$

According to this A/D converter, the second A/D conversion operation is performed appropriately.

With the A/D converter according to the present invention, in the first storage operation, the first capacitor is connected between the first output or the input of the gain stage and the reference potential, and the second capacitor is connected between the second output or the input of the gain stage and the reference potential.

According to this A/D converter, the standard reference voltage supplied from the first output, or the analog signal supplied from the input of the gain stage is stored in the first capacitor, and the standard reference voltage supplied from the second output, or the analog signal supplied from the input of the gain stage is stored in the second capacitor.

Moreover, another aspect of the present invention is a single-ended A/D converter comprising a gain stage which includes an input for receiving an analog signal to be converted into a digital value, an output, and an operational amplifier circuit having a first input, a second input and an output, an A/D conversion circuit which refers to a conversion reference voltage and generates a digital signal including one or more bits based on a signal from the output of the gain stage, a logical circuit which generates a control signal according to the digital signal, a D/A conversion circuit which has first and second outputs, and provides at least a first standard reference voltage or a second standard reference voltage to the gain stage via the first and second outputs in accordance with the control signal, and a reference voltage generation circuit which generates the conversion reference voltage by dividing the first and second standard reference voltages, wherein the gain stage includes first to third capacitors, a capacity of the third capacitor is greater than capacities of the first and second capacitors, the second input of the operational amplifier circuit receives a reference potential, the first standard reference voltage is higher than the second standard reference voltage value, the D/A conversion circuit includes a switch circuit for providing either the first or second standard reference voltage to the first output and providing either the first or second standard reference voltage to the second output in response to the control signal, the A/D converter performs a first A/D conversion operation of causing the A/D conversion circuit to refer to one conversion reference voltage or the first and second conversion reference voltages and generate a 1 bit or ternary digital signal, and a second A/D conversion operation of causing the A/D conversion circuit to refer to the first and second conversion reference voltages and generate a ternary digital signal, the reference voltage generation circuit generates a voltage that is higher than a median between the first standard reference voltage and the second standard reference voltage value and lower than the first standard reference voltage as the first conversion reference voltage for the second A/D conversion operation, and generates a voltage that is lower than the median and higher than the second standard reference voltage as the second conversion reference voltage for the second A/D conversion operation, and generates the median as the one conversion reference voltage for the first A/D conversion, or generates a voltage that is higher than the first conversion reference voltage for the second A/D conversion operation and lower than the first standard reference voltage as the first conversion reference voltage for the first conversion operation and generates a voltage that is lower than the second conversion reference voltage for the second A/D conversion operation and higher than the second standard reference voltage as the second conversion reference voltage for the first conversion operation.

Another aspect of the present invention is an image sensor device. This image sensor device comprises a cell array including an array of image sensor cells, and a converter array connected to the cell array and including a plurality of A/D converters, wherein each of the A/D converters is connected to the image sensor cells via a column line of the cell array, and each of the A/D converters is the foregoing A/D converter. According to this image sensor device, the area of the image sensor device can be reduced since the A/D converter is constructed with a single-ended configuration.

Yet another aspect of the present invention is a method of generating a digital signal from an analog signal using an A/D converter. This method is a method of generating a digital signal from an analog signal using the A/D converter described above, comprising: a first initial storage step of storing the analog signal from the input of the gain stage in the first capacitor, and connecting the output and the first input of the operational amplifier circuit to perform the first storage operation, a first arithmetic step of connecting the first capacitor between the first output and the first input and performing the first arithmetic operation, a first storage step of storing the analog signal from the input of the gain stage in the first capacitor and performing the first storage operation, an integral A/D conversion step of repeating the first arithmetic step and the first storage step a predetermined number of times, a second initial storage step of storing a residual analog signal as an operation value in the integral A/D conversion step in the first and second capacitors and performing the second storage operation, a second arithmetic step of performing the second arithmetic operation, a second storage step of storing, in the first and second capacitors, the operation value generated in the output of the gain stage in the second arithmetic step and performing the second storage operation, and a cyclic A/D conversion step of repeating the second arithmetic step and the second storage step a predetermined number of times.

According to this method, as a result of using a single-ended A/D converter and subjecting the input analog signal to folding integration A/D conversion and subjecting the residual analog signal thereof to cyclic A/D conversion, a digital signal corresponding to an analog signal based on the results of both A/D conversions is generated.

The method of generating a digital signal from an analog signal using an A/D converter according to the present invention is a method of generating a digital signal from an analog signal from an image sensor device including an array of image sensor cells by using the foregoing A/D converter, the image sensor cells being capable of generating a first signal which indicates a reset level, and a second signal which indicates a signal level superimposed on the reset level, the method comprising a first initial storage step of storing the first signal received via the input of the gain stage in the first capacitor, and connecting the output and the first input of the gain stage to perform the first storage operation, a first reset level arithmetic step of connecting the first capacitor between the first output and the first input and performing the first arithmetic operation, a first reset level storage step of storing the analog signal from the input of the gain stage in the first capacitor and performing the first storage operation, a first reset level integral A/D conversion step of repeating the first reset level arithmetic step and the first reset level storage step a predetermined number of times, a first signal level storage step of storing a first or second standard reference voltage supplied from the first output in the first capacitor and performing the first storage operation, a first signal level arithmetic step of connecting the first capacity between the input and the first input of the gain stage to which the second signal has been supplied and performing the first arithmetic operation, a first signal level integral A/D conversion step of repeating the first signal level arithmetic step and the first signal level storage step a predetermined number of times, a second initial storage step of storing, in the first and second capacitors, a residual analog signal as an operation value in the first signal level integral A/D conversion step, and performing the second storage operation, a second arithmetic step of performing the second arithmetic operation, a second storage step of storing, in the first and second capacitors, the operation value generated in the output of the gain stage in the second arithmetic step, and performing the second storage operation, and a cyclic A/D conversion step of repeating the second arithmetic step and the second storage step a predetermined number of times.

According to this method, since the first signal level integral A/D conversion step is performed to the second signal so that the analog signal is integrated in an anti-phase after the first reset level integral A/D conversion step is performed to the first signal, variation in the signals from the image sensor cell can be cancelled.

Advantageous Effects of Invention

According to the present invention, an A/D converter which performs A/D conversion based on folding integration and cyclic A/D conversion of a residual analog signal thereof can be realized with a single-ended configuration.

DESCRIPTION OF EMBODIMENTS

Figure 1:
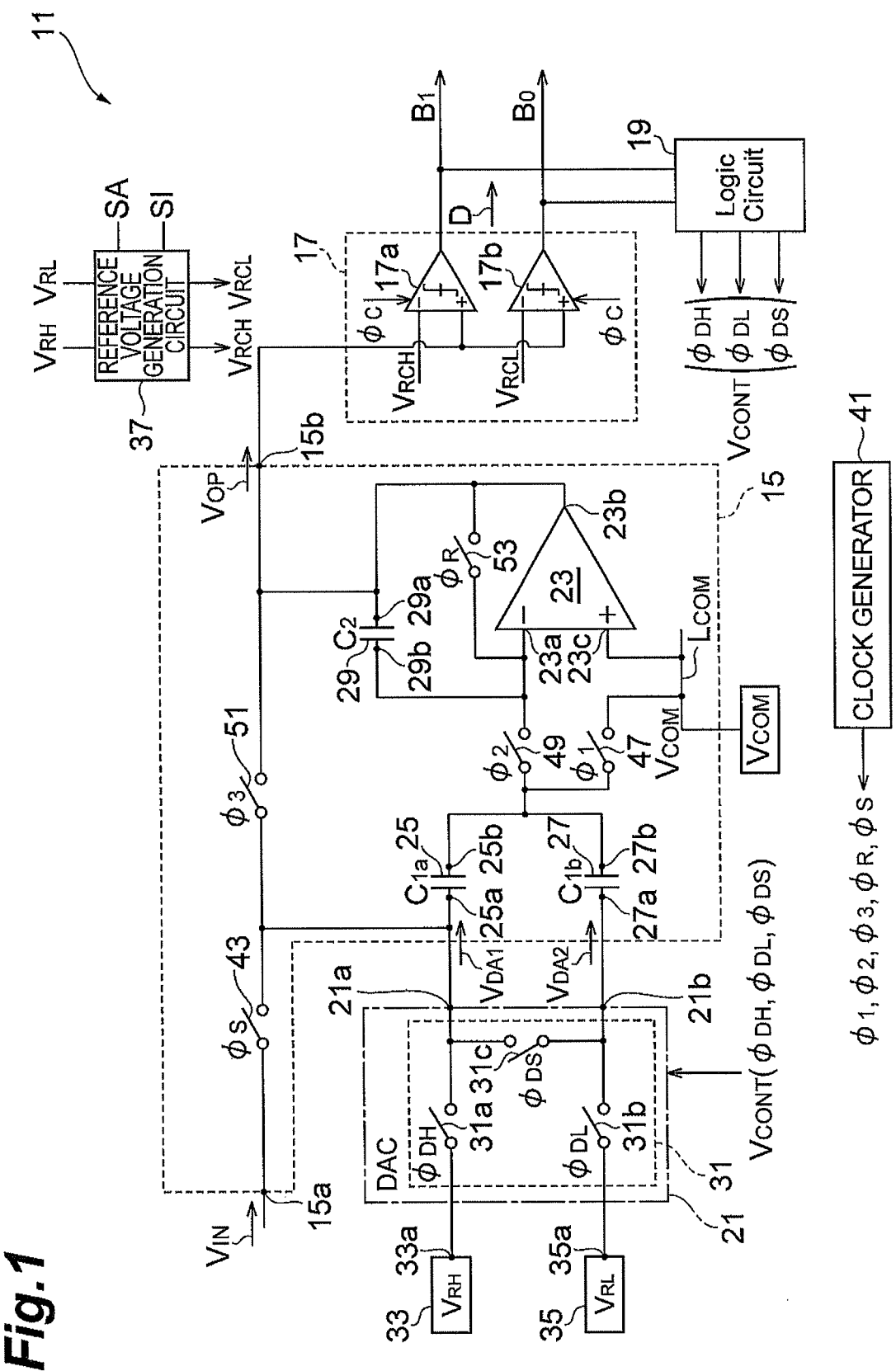
FIG. 1 is a diagram showing circuit block of the A/D converter according to an embodiment of the present disclosure.

The findings of the present invention can be easily understood by referring to the appended drawings as illustrated examples and giving consideration to the ensuing detailed description. An embodiment of the A/D converter, the image sensor device, and the method of generating a digital signal from an analog signal of the present invention are now explained with reference to the appended drawings. When possible, the same reference numeral is given to the same component.

FIG. 1 is a circuit diagram of the A/D converter according to this embodiment. The A/D converter 11 performs a first A/D conversion operation, which is a so-called folding integral A/D conversion, and a second A/D conversion operation which is a cyclic A/D conversion by using a same circuit configuration. The A/D converter 11 realizes the first and second A/D conversion operations by changing the time-series control pattern of a switch provided to the A/D converter 11.

The A/D converter 11 comprises a gain stage 15, an A/D conversion circuit 17, a logical circuit 19, and a D/A conversion circuit 21. Moreover, the A/D converter 11 includes a reference voltage generation circuit 37 and a clock generator 41.

The gain stage 15 includes an input 15a which receives an analog signal $V_{IN}$ to be converted into a digital value, and an output 15b which provides an operation value $V_{OP}$. Moreover, the gain stage 15 includes a single ended operational amplifier circuit 23, and first to third capacitors 25, 27, 29.

The operational amplifier circuit 23 includes a first input 23a, an output 23b, and a second input 23c, and the phase of the signal of the output 23b is an inversion of the phase of the signal provided to the first input 23a. For example, the first and second inputs 23a, 23c are respectively an inverted input terminal and a non-inverted input terminal, and the output 23b is a non-inverted output terminal. For example, the second input 23c of the operational amplifier circuit 23 is connected to a reference potential line $L_{COM}$, and receives a reference potential $V_{COM}$.

Moreover, the gain stage 15 includes a plurality of switches for the connection of the capacitors 25, 27, 29 and the operational amplifier circuit 23. The arrangement of the switches 43, 47, 49, 51, 53, 55 shown in FIG. 1 is an example. The control of the switches 43, 47, 49, 51, 53 is performed by the clock generator 41.

Moreover, the gain stage 15 can perform a first arithmetic operation and a first storage operation in the first A/D conversion operation, and perform a second arithmetic operation and a second storage operation in the second A/D conversion operation.

In the first arithmetic operation an operation value $V_{OP}$ is generated with the operational amplifier circuit 23 and the first to third capacitors 25, 27, 29.

In the first storage operation, the first capacitor 25 stores a first or second standard reference voltage $V_{RH}$, $V_{RL}$ supplied from the first output 21a of the D/A conversion circuit 21 or an analog signal $V_{IN}$ supplied from the input 15a of the gain stage. Moreover, in the first storage operation, the second capacitor 27 stores a first or second standard reference voltage $V_{RH}$, $V_{RL}$ supplied from the second output 21b of the D/A conversion circuit 21. Moreover, in the first storage operation, the third capacitor 29 retains the operation value $V_{OP}$ by being connected between the output 23b and the first input 23a of the operational amplifier circuit 23.

Moreover, in the first arithmetic operation, when the first or second standard reference voltage $V_{RH}$, $V_{RL}$ is stored in the first capacitor 25 in the first storage operation, the first capacitor 25 is connected between the input 15a to receive the analog signal $V_{IN}$ and the first input 23a of the operational amplifier circuit 23, and when the analog signal $V_{IN}$ is stored in the first capacitor 25 in the first storage operation, the first capacitor 25 is connected between the first output 21a of the D/A conversion circuit 21 and the first input 23a of the operational amplifier circuit 23. Moreover, in the first arithmetic operation, the second capacitor 27 is connected between the second output 21b of the D/A conversion circuit 21 and the first input 23a of the operational amplifier circuit 23. In addition, in the first arithmetic operation, the operation value $V_{OP}$ is generated in the output 15b of the gain stage 23 by the third capacitor 29 being connected between the output 23b and the first input 23a of the operational amplifier circuit 23.

In the second storage operation, the operation value $V_{OP}$ is stored in the first and second capacitors 25, 27. In the second arithmetic operation, the operation value $V_{OP}$ is generated with the operational amplifier circuit 23 and the first to third capacitors 25, 27, 29. In other words, in the second arithmetic operation, the operation value $V_{OP}$ is generated in the output 15b of the gain stage 15 by the third capacitor 29 being connected between the output 23b and the first input 23a of the operational amplifier circuit 23 and the first and second capacitors 25, 27 being respective connected between the first output 21a or the second output 21b and the first input 23a of the D/A conversion circuit 21.

The first to third capacitors 25, 27, 29 are capacities to be used for the storage and operation of various signal values. Here, the capacity $C_2$ of the third capacitor 29 is greater than the capacities $C_{1a}$, $C_{1b}$ of the first and second capacitors 25, 27. Consequently, the analog signal $V_{IN}$ that is input in the first A/D conversion operation as the folding integral A/D conversion is attenuated according to the capacity ratio ($C_{1a}/C_2$, $C_{1b}/C_2$), and subject to integration. Consequently, the voltage range of the analog signal $V_{IN}$ that is output in the folding integral A/D conversion also decreases in accordance with the capacity ratio of the capacitors, and the A/D converter 11 can be therefore constructed with a single-ended configuration.

Note that the third capacitor 29 has a capacity that is double the capacity of the first capacitor 25 or the second capacitor 27. In other words, the relation of $C_{1a}=\frac{1}{2}\times C_2$ and $C_{1b}=\frac{1}{2}\times C_2$ is established. According to the A/D converter 11 having the foregoing capacitors, the analog signal $V_{IN}$ that is input in the folding integral A/D conversion is attenuated to ½ and subject to sampling and integration. Thus, since the voltage range of the analog signal $V_{OP}$ that is output in the folding integral A/D conversion also becomes ½ in accordance with the capacity ratio of the capacitors, an input voltage that is suitable for a single-ended A/D converter is provided in the second A/D conversion operation as the cyclic A/D conversion.

The A/D conversion circuit 17 generates a digital signal D according to the conversion reference voltages $V_{RCH}$, $V_{RCL}$ based on the signal $V_{OP}$ from the output 23b of the gain stage 23.

The A/D conversion circuit 17 may include, for example, two comparators 17a, 17b. The comparators 17a, 17b respectively compare the input analog signal with respective predetermined first and second conversion reference voltages $V_{RCH}$, $V_{RCL}$, and, as shown in FIG. 1, provide the comparative result signals $B_0$, $B_1$. The conversion reference voltages $V_{RCH}$, $V_{RCL}$ in the A/D conversion circuit 17 are provided by the reference voltage generation circuit 37. The digital signal D indicates the A/D conversion value. The digital signal D includes, for instance, 2 bits ($B_0$, $B_1$), and the respective bits ($B_0$, $B_1$) may take on "1" or "0". The digital signal D is expressed as (D=$B_0$+$B_1$). With the A/D converter 11, one integration operation based on a combination of bits ($B_0$, $B_1$) or a digital value for each round has first to third values (D=0, D=1, D=2). In other words, the comparators 17a, 17b perform operations as follows:

when $V_{OP} > V_{RCH}$, $B_1=1$, $B_0=1$;

when $V_{RCL} < V_{OP} \leq V_{RCH}$, $B_1=0$, $B_0=1$; and when $V_{OP} \leq V_{RCL}$, $B_1=0$, $B_0=0$.

Moreover, the A/D conversion circuit 17 may also generate the digital signal D by using, for example, one comparator 17a in the first A/D conversion operation. In the foregoing case, the digital signal D is only 1 bit ($B_1$), and may express a binary. Moreover, the signal that is used as a reference in the comparator 17a is the conversion reference voltage $V_{RCH}$. In the foregoing case, the comparator 17a performs operations as follows:

when $V_{OP} > V_{RCH}$, $B_1=1$; and when $V_{OP} \leq V_{RCH}$, $B_1=0$.

Figure 2:
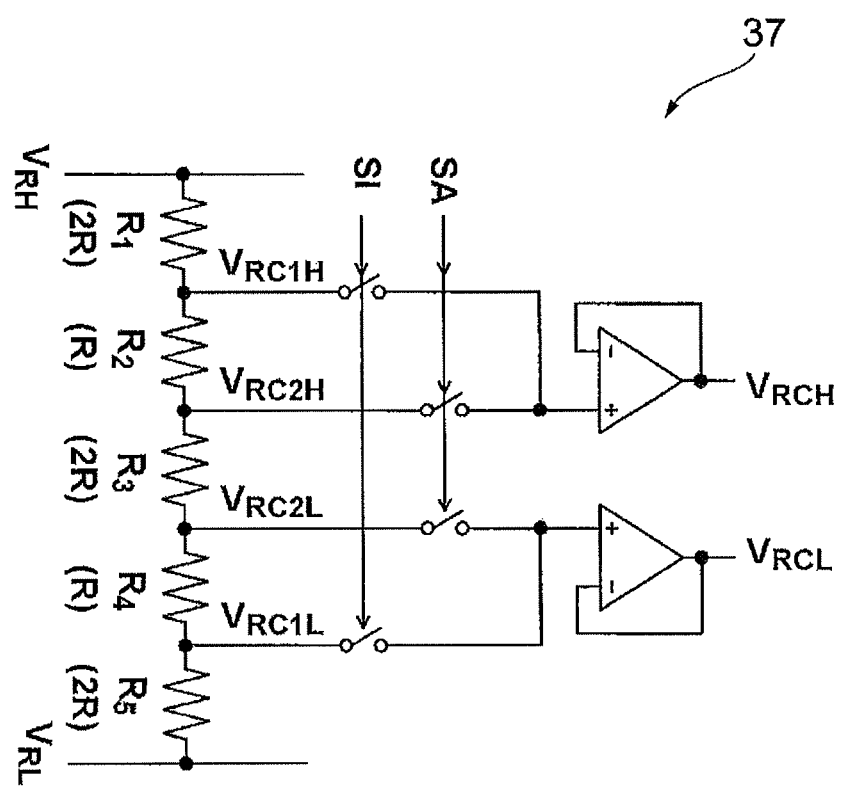
FIG. 2 is a circuit diagram of a reference voltage generation circuit in the cyclic A/D converter shown in FIG. 1.

The reference voltage generation circuit 37 is a circuit for generating the first and second conversion reference voltages $V_{RCH}$, $V_{RCL}$ based on the first and second standard reference voltages $V_{RH}$, $V_{RL}$. Note that the first standard reference voltage $V_{RH}$ and the second standard reference voltage $V_{RL}$ are supplied from the reference voltage sources 33, 35. FIG. 2 is an example of the circuit diagram of the reference voltage generation circuit 37. As shown in FIG. 2, the reference voltage generation circuit 37 is a circuit which generates a reference voltage, for example, by dividing the first and second standard reference voltages with a ladder resistor, and generates voltages $V_{RC1H}$, $V_{RC2H}$, $V_{RC2L}$, $V_{RC1L}$ according to resistors $R_1$ to $R_5$ having a predetermined resistance value based on the first and second standard reference voltages $V_{RH}$, $V_{RL}$. In the first A/D conversion operation, the voltages $V_{RC1H}$, $V_{RC1L}$ are supplied as the first and second conversion reference voltages $V_{RCH}$, $V_{RCL}$ based on the operation of the switch SI. Meanwhile, in the second A/D conversion operation, the voltage $V_{RC2H}$, $V_{RC2L}$ are supplied as the first and second conversion reference voltages $V_{RCH}$, $V_{RCL}$ based on the operation of the switch SA.

According to the reference voltage generation circuit 37, the first conversion reference voltage $V_{RCH}$ is higher than a median between the first standard reference voltage $V_{RH}$ and the second standard reference voltage value $V_{RL}$ and lower than the first standard reference voltage $V_{RH}$. Moreover, the first conversion reference voltage $V_{RCH}$ in the first A/D conversion operation is higher than the first conversion reference voltage $V_{RCH}$ in the second A/D conversion operation. Moreover, the second conversion reference voltage $V_{RCL}$ is lower than a median between the first standard reference voltage $V_{RH}$ and the second standard reference voltage value $V_{RL}$, and higher than the second standard reference voltage $V_{RL}$. Moreover, the second conversion reference voltage $V_{RCL}$ in the first A/D conversion operation is lower than the second conversion reference voltage $V_{RCL}$ in the second A/D conversion operation. Since the first and second conversion reference voltages $V_{RCH}$, $V_{RCL}$ are generated as described above, the first A/D conversion operation and the second A/D conversion operation are performed appropriately.

Moreover, for example, by setting the resistance values of the resistors $R_1$ to $R_5$ to be values such as resistor $R_1=2R$, resistor $R_2=R$, resistor $R_3=2R$, resistor $R_4=R$, resistor $R_5=2R$ (R is a predetermined resistance value), preferably the voltages $V_{RC1H}$, $V_{RC1L}$ expressed by the following formulae are supplied as the first and second conversion reference voltages $V_{RCH}$, $V_{RCL}$ in the first A/D conversion operation:

$V_{RC1H}=(3 V_{RH}+V_{RL})/4$; and $V_{RC1L}=(V_{RH}+3 V_{RL})/4$.

Moreover, preferably, the voltage $V_{RC2H}$, $V_{RC2L}$ expressed by the following formulae are supplied as the first and second conversion reference voltages $V_{RCH}$, $V_{RCL}$ in the second A/D conversion operation:

$V_{RC2H}=(5 V_{RH}+3 V_{RL})/8$; and $V_{RC2L}=(3 V_{RH}+5 V_{RL})/8$.

Since the first and second conversion reference voltages $V_{RCH}$, $V_{RCL}$ are generated as described above, the second A/D conversion operation is performed even more appropriately.

Figure 3:
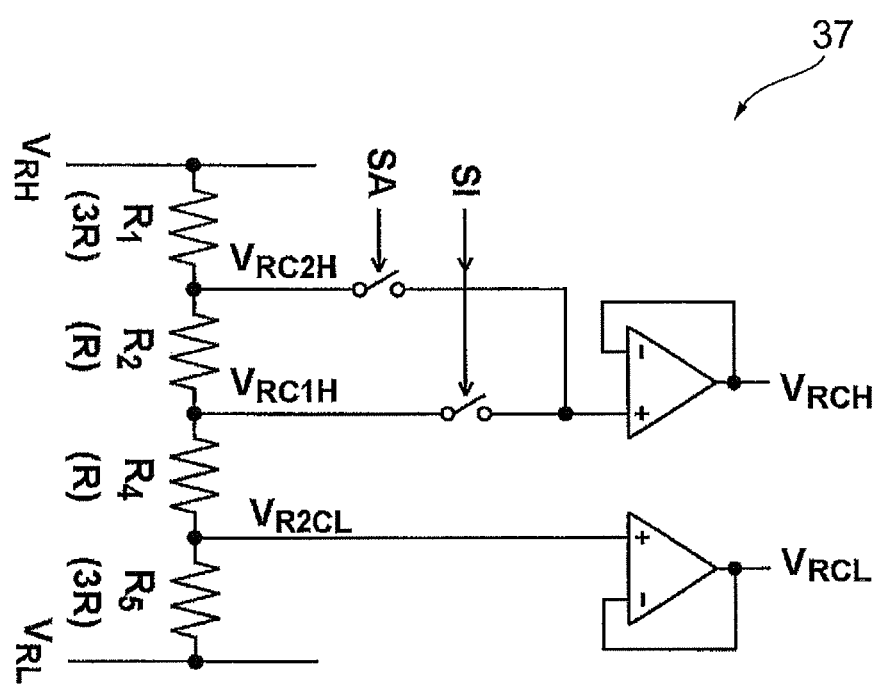
FIG. 3 is a circuit diagram of a reference voltage generation circuit in the cyclic A/D converter shown in FIG. 1.

Moreover, an example of the circuit diagram of the reference voltage generation circuit 37 in a case where the A/D conversion circuit 17 uses one comparator 17a to generate the digital signal D in the first A/D conversion operation is shown in FIG. 3. According to this reference voltage generation circuit 37, in the first A/D conversion operation, the voltage $V_{RC1H}$ is supplied as the first conversion reference voltage $V_{RCH}$ based on the operation of the switch SI. Meanwhile, in the second A/D conversion operation, the voltages $V_{RC2H}$, $V_{RC2L}$ are supplied as the first and second conversion reference voltages $V_{RCH}$, $V_{RCL}$ based on the operation of the switch SA.

According to this reference voltage generation circuit 37, the first conversion reference voltage $V_{RCH}$ in the first A/D conversion operation is a median between the first standard reference voltage $V_{RH}$ and the second standard reference voltage value $V_{RL}$. Moreover, the voltages $V_{RC2H}$, $V_{RC2L}$ expressed by the following formulae are supplied as the first and second conversion reference voltages $V_{RCH}$, $V_{RCL}$ in the second A/D conversion operation:

$V_{RC2H}=(5 V_{RH}+3 V_{RL})/8$; and $V_{RC2L}=(3 V+5 V_{RL})/8$.

The logical circuit 19 generates a control signal $V_{CONT}$ (for instance, $\phi_{DH}$, $\phi_{DL}$, $\phi_{DS}$) according to the digital signal D. Generation of the control signal $V_{CONT}$ will be described later with reference to FIG. 4.

The D/A conversion circuit 21 includes first and second outputs 21a, 21b, and provides at least the first standard reference voltage $V_{RH}$ or the second standard reference voltage $V_{RL}$ to the gain stage 15 via the first and second outputs 21a, 21b according to the control signal $V_{CONT}$. The first standard reference voltage $V_{RH}$ and the second standard reference voltage $V_{RL}$ are supplied from the reference voltage sources 33, 35. The D/A conversion circuit 21 includes a switch circuit 31 for providing, in response to a control signal, one of either the first or second standard reference voltage $V_{RH}$, $V_{RL}$, to the first output 21a, and providing one of either the first or second standard reference voltage $V_{RH}$, $V_{RL}$ to the second output 21b.

The switch circuit 31, by operating the switches 31a, 31b, supplies the first and second standard reference voltages $V_{RH}$, $V_{RL}$ to the first and second outputs 21a, 21b, respectively, and, by operating the switches 31a, 31c, supplies the first standard reference voltage $V_{RH}$ to both the first and second outputs 21a, 21b, and, by operating the switches 31b, 31c, supplies the second standard reference voltage $V_{RL}$ to both the first and second outputs 21a, 21b. The first and second outputs 21a, 21b of the D/A conversion circuit 21 are respectively connected to one ends 25a, 27a of the first and second capacitors 25, 27. Since the opening and closing of the switches 31a to 31c are respectively controlled by the control signals $\phi_{DH}$, $\phi_{DS}$, $\phi_{DL}$ from the logical circuit 17, the values of the digital signals B1, B0 determine whether any one of the control signals $\phi_{DH}$, $\phi_{DS}$, $\phi_{DL}$ will become active.

When the voltages supplied from the first and second outputs 21a, 21b are respectively $V_{DA1}$, $V_{DA2}$, the D/A conversion circuit 21 performs, for example, the following control in response to the control signal $V_{CONT}$ from the logical circuit 17:

when condition D=2 is satisfied: $V_{DA1}=V_{DA2}=V_{RH}$;

when condition D=1 is satisfied: $V_{DA1}=V_{RH}$, $V_{DA2}=V_{RL}$; and when condition D=0 is satisfied: $V_{DA1}=V_{DA2}=V_{RL}$.

Moreover, in the first A/D conversion operation, in a configuration where the A/D conversion circuit 17 uses one comparator 17a to generate the digital signal D, the D/A conversion circuit 21 performs the following control in accordance with the control signal $V_{CONT}$ based on the digital signal $B_1$ from the comparator 17a:

when condition $B_1$=1 is satisfied: $V_{DA1}=V_{RH}$, $V_{DA2}=V_{RL}$; and when condition $B_1$=0 is satisfied: $V_{DA1}=V_{DA2}=V_{RL}$.

Figure 4:
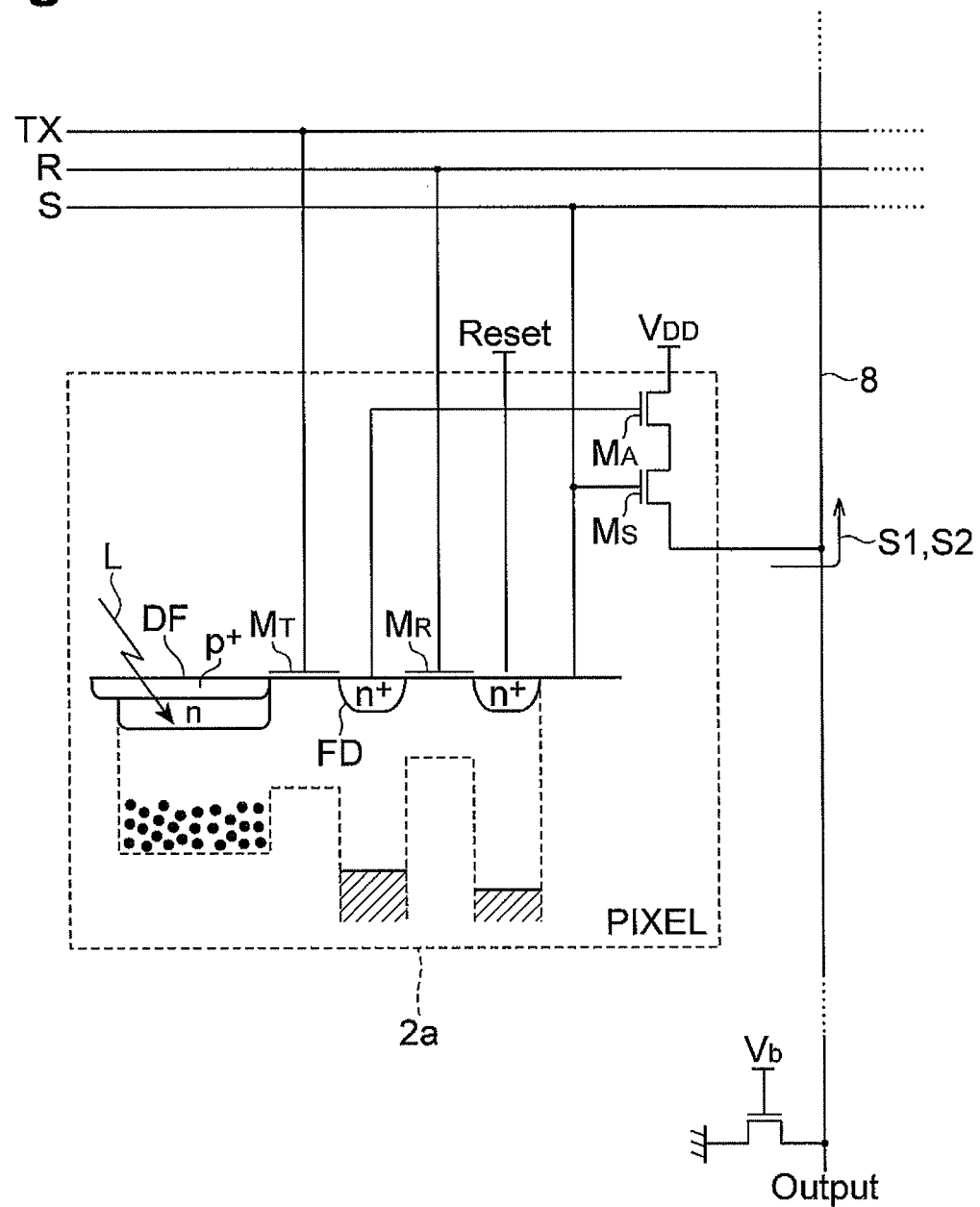
FIG. 4 is a diagram showing an image sensor cell.

Another aspect of the present invention is an image sensor device. FIG. 4 is a diagram showing a pixel of an image sensor. This image sensor device comprises a cell array including an array of image sensor cells 2a, and a converter array which is connected to the cell array and includes a plurality of A/D converters 11. Each of the A/D converters 11 is connected to the image sensor cells 2a via a column line 8 of the cell array.

The image sensor cell 2a has a structure, for instance, of a CMOS image sensor cell. A photodiode DF receives one pixel worth of light L related to the image. A gate of a selection transistor $M_S$ is connected to a row selection line S extending in a row direction. A gate of a reset transistor $M_R$ is connected to a reset line R. A gate of a transfer transistor $M_T$ is connected to a transfer selection line extending in a row direction. One end of the photodiode DF is connected to a floating diffusion layer FD via the transfer transistor $M_T$. The floating diffusion layer FD is connected to a reset potential line Reset via the reset transistor $M_R$ and also connected to the gate of the transistor $M_A$. One current terminal (for instance, a drain) of the transistor $M_A$ is connected to the column line 8 via the selection transistor $M_S$. The transistor $M_A$ provides a potential to the column line via the selection transistor $M_S$ according to the electric charge of the floating diffusion layer FD.

The image sensor cell 2a structured as described above can generate a first signal indicating a reset level, and a second signal indicating a signal level that is superimposed on the reset level. In other words, the image sensor cell 2a foremost provides the reset control signal R to the reset transistor $M_R$, and resets the floating diffusion layer FD. This reset level is read via the amplifying transistor $M_A$. Subsequently, the electric charge transfer control signal TX is provided to the transfer transistor $M_T$, and a photoinduced signal electric charge is transferred from the photodiode DF to the floating diffusion layer. Thereafter, this signal level is read via the transistor $M_A$. Accordingly, the pixel 2a can generate a first signal S1 indicating a reset level, and a second signal S2 indicating a signal level that is superimposed on the reset level.

Figure 5:
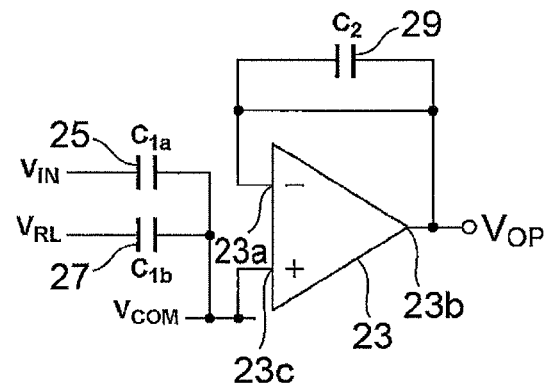
FIG. 5 is a diagram showing an operation of the integral VD conversion in the A/D converter shown in FIG. 1.
Figure 5:
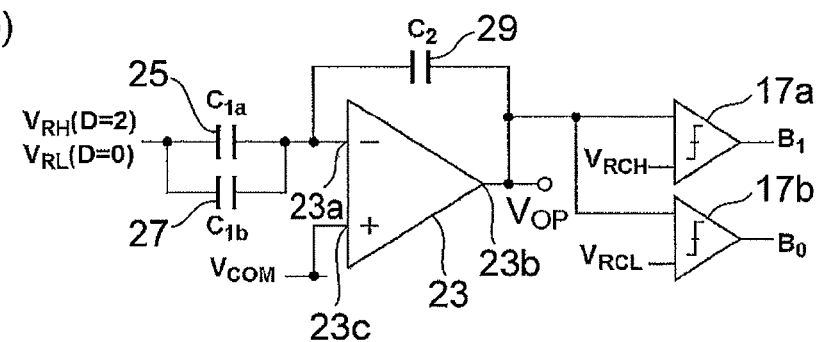
Figure 5:
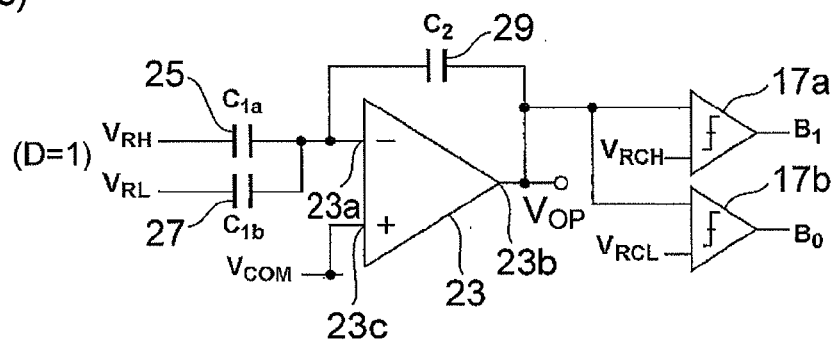
Figure 5:
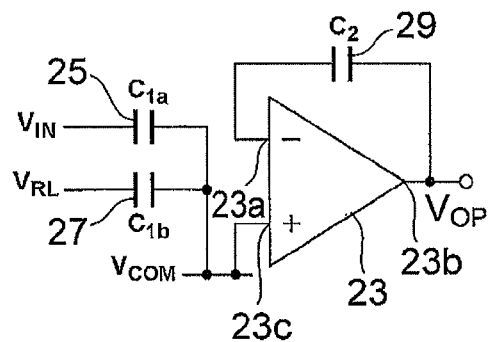

Explanation of the first A/D conversion operation in the A/D converter 11 shown in FIG. 1 is continued with reference to FIG. 5.

In FIG. 5(a), the A/D converter 11 performs a first storage operation as a first initial storage step. In this step, the analog signal $V_{IN}$ that was received via the input 15a of the gain stage 15 is stored in the first capacitor 25, and the output 23b and the first input 23a of the gain stage 15 are connected. Moreover, the second capacitor 27 stores the second standard reference voltage $V_{RL}$ supplied from the second output 21b, and the third capacitor 29 is connected between the output 23b and the first input 23a of the operational amplifier circuit 23.

The storage and connection in the first initial storage step and the respective steps explained below are realized by the switch circuit 31 and the switches 43, 47, 49, 51, 53. In the first initial storage step, the switches 31c, 47, 53, 43 are caused to be conducting and the switches 31a, 31b, 49, 51 are caused to be non-conducting based on the control signals ($\phi_{DH}$=0, $\phi_{DS}$=0, $\phi_{DL}$=1) and the clock signals ($\phi_1$=1, $\phi_2$=0, $\phi_3$=0, $\phi_R$=1, $\phi_S$=1).

Here, the electric charges ($Q_{1a}$, $Q_{1b}$) accumulated in the capacities $C_{1a}$, $C_{1b}$ will be as follows:

$$Q_{1a}=C_{1a}(V_{IN}-V_{COM}) \quad (1); \text{ and}$$

$$Q_{1b}=C_{1b}(V_{RL}-V_{COM}) \quad (2).$$

Subsequent to the first initial storage step, the A/D converter 11 performs a first arithmetic operation as a first arithmetic step shown in FIG. 5(b) or FIG. 5(c) according to the value of D (=$B_1$+$B_0$).

In this step, the first arithmetic operation is performed upon connecting the first capacitor 25 between the first output 21a and the first input 23a. Moreover, the operation value $V_{OP}$ is generated in the output 15b of the gain stage 15 by the second capacitor 27 being connected between the second output 21b and the first input 23a, and the third capacitor 29 being connected between the output 23b and the first input 23a of the operational amplifier circuit 23. In the first arithmetic step, the switch 49 is caused to be conducting and the switches 47, 51, 53, 43 are caused to be non-conducting based on the clock signals ($\phi_1$=0, $\phi_2$=1, $\phi_3$=0, $\phi_R$=0, $\phi_S$=0).

The first standard reference voltage $V_{RH}$ or the second standard reference voltage $V_{RL}$ is provided to the first output 21a and the second output 21b of the D/A conversion circuit 21 based on the control of the switch circuit 31 according to the output value D (=$B_1$+$B_0$) from the comparators 17a, 17b.

The comparators 17a, 17b perform operations as follows:

when $V_{OP}>V_{RCH}$, $B_1$=1, $B_0$=1:

when $V_{RCL}<V_{OP}\leq V_{RCH}$, $B_1$=0, $B_0$=1; and when $V_{OP}\leq V_{RCL}$, $B_1$=0, $B_0$=0 \quad (3).

When D=2, the operation of FIG. 5(b) is performed while control is carried out such that the first standard reference voltage $V_{RH}$ is provided from the first output 21a and the second output 21b of the D/A conversion circuit 21. Meanwhile, when D=0, the operation of FIG. 5(b) is performed while control is carried out such that the second standard reference voltage $V_{RL}$ is provided from the first output 21a and the second output 21b of the D/A conversion circuit 21. In addition, when D=1, the operation of FIG. 5(c) is performed while control is carried out such that the first standard reference voltage $V_{RH}$ and the second standard reference voltage $V_{RL}$ are respectively provided from the first output 21a and the second output 21b of the D/A conversion circuit 21. Let it be assumed that the output value of the result of this operation is D(2).

For example, in the first initial storage step, since it is $V_{OP}=V_{COM}$, consequently $B_1=0$, $B_0=1$. Accordingly, since it is D=1, the operation shown in FIG. 5(c) is performed. The output $V_{OP}$ in the foregoing case will be as follows.

$$V_{OP}(1) = V_{COM} + \frac{C_{1a}(V_{IN} - V_{RL}) + C_{1b}(V_{RL} - V_{RL})}{2} \qquad (4)$$
$$= V_{COM} + \frac{1}{2}(V_{IN} - V_{RL})$$

Subsequently, the A/D converter 11 performs a first storage operation shown in FIG. 5(d) as a first storage step. In the first storage step, the analog signal $V_{IN}$ from the input 15a of the gain stage 15 is stored in the first capacitor 25 and the second standard reference voltage $V_{RL}$ supplied from the second output 21b is stored in the second capacitor 27, while retaining the operation value $V_{OP}$ in the capacity $C_2$, by connecting the third capacitor 29 between the output 23b and the first input 23a of the operational amplifier circuit 23. In the first storage step, the switches 31c, 47, 43 are caused to be conducting and the switches 31a, 31b, 49, 51, 53 are caused to be non-conducting based on the control signals ($\phi_{DH}=0$, $\phi_{DS}=0$, $\phi_{DL}=1$) and the clock signals $\phi_1=1$, $\phi_2=0$, $\phi_3=0$, $\phi_R=0$, $\phi_S=1$).

Subsequently, in accordance with the value of D(2), the A/D converter 11 performs a first arithmetic operation as a first arithmetic step shown in FIG. 5(b) or FIG. 5(c). In other words, while selecting the first arithmetic operation shown in either FIG. 5(b) or FIG. 5(c) according to the value of the output value D, the A/D converter 11 implements an integral A/D conversion step of repeating the first arithmetic step and the first storage step a predetermined number of times.

The operation value in the foregoing case is expressed as shown in Formula (5) below.

$$V_{OP}(2) = V_{OP}(1) + \frac{C_{1a}V_{IN} + C_{1b}V_{RL} - C_{1a}(V_{RH}B_0 + V_{RL}\overline{B}_0) - C_{1b}(V_{RH}B_1 + V_{RL}\overline{B}_1)}{C_2} \qquad (5)$$
$$= V_{OP}(1) + \frac{1}{2}(V_{IN} - V_{RL}) - \Delta V_R D(2)$$

Here, $\Delta V_R$ in Formula (5) is expressed as shown in Formula (6) below.

$$\Delta V_R = \frac{1}{2}(V_{RH} - V_{RL}) \qquad (6)$$

In the integral A/D conversion step, the operation value VOP upon repeating the first arithmetic step and the first storage step M times and performing sampling and integration is expressed as shown in Formula (7) below.

$$V_{OP}(M) = V_{COM} + \frac{M}{2}(V_{IN} - V_{RL}) - \Delta V_R \sum_{i=1}^{M} D(i) \qquad (7)$$

As shown in the second term on the right side of Formula (7), when ½ gain is applied to the analog signal $V_{IN}$ as the input signal, sampling M times, and performing a folding integral A/D conversion, the amplitude range of the output thereof (operation value $V_{OP}$) will be the same as the input signal.

Figure 6:
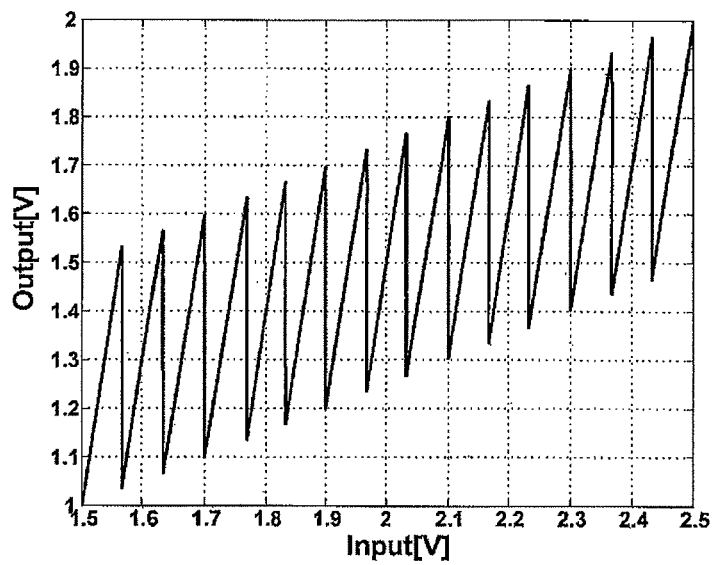
FIG. 6 is a diagram showing the I/O characteristics of the gain stage based on simulation.
Figure 6:
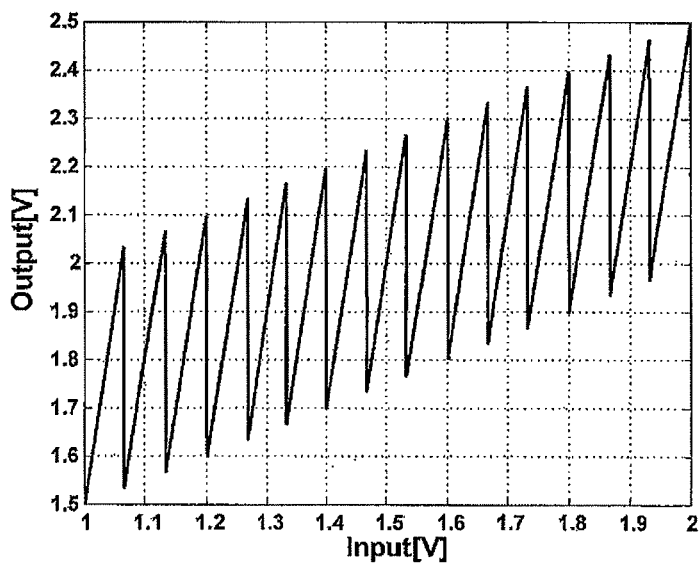

FIG. 6 is a diagram showing the I/O characteristics during the operation (folding integral A/D conversion) as the integral A/D converter of the gain stage 15 that was obtained based on simulation. FIG. 6(a) is a diagram showing the I/O characteristics in the conditions of ($V_{RH}=2$ V, $V_{RL}=1$ V, reference voltage $V_{RI}=V_{RL}$ in the arithmetic operation, $V_{COM}=1.5$ V, sampling frequency M=16). As shown in FIG. 6(a), the output is 1 to 2 V relative to the input of the amplitude 1 V of 1.5 to 2.5 V, and the amplitude is contained with the range of 1 V.

Note that the foregoing explanation is an example when the second standard reference voltage $V_{RL}$ is adopted as the reference voltage $V_{RI}$ in the arithmetic operation. In other words, in FIGS. 5(a) and 5(d), the second standard reference voltage $V_{RL}$ is supplied to the second capacitor 27. Meanwhile, the first standard reference voltage $V_{RH}$ may also be adopted as the reference voltage $V_{RI}$ in the arithmetic operation. When the first standard reference voltage $V_{RH}$ is adopted, the absolute value of the output will differ in comparison to the case of adopting the second standard reference voltage $V_{RL}$. In the foregoing case, Formula (7) is modified to Formula (8) below.

$$V_{OP}(M) = V_{COM} + \frac{M}{2}(V_{IN} - V_{RH}) - \Delta V_R \sum_{i=1}^{M} (D(i) - 1) \qquad (8)$$

Moreover, FIG. 6(b) is a diagram showing the I/O characteristics in the conditions of ($V_{RH}=2.5$ V, $V_{RL}=1.5$ V, reference voltage $V_{RI}=V_{RH}$ in the arithmetic operation, $V_{COM}=2.0$ V, sampling frequency M=16). As shown in FIG. 6(b), the output is 1.5 to 2.5 V relative to the input of the amplitude 1 V of 1.0 to 2.0 V, and the amplitude is contained with the range of 1 V.

Figure 7:
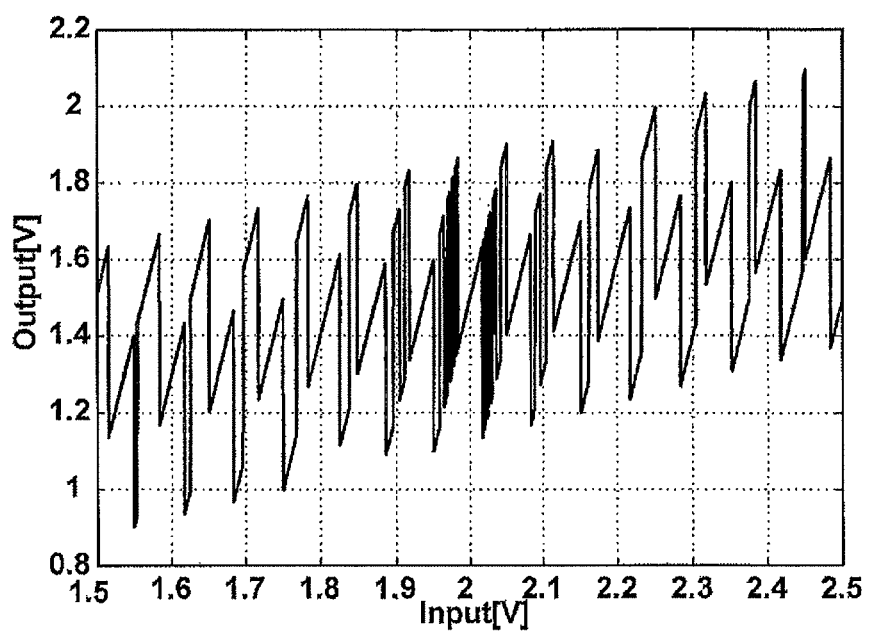
FIG. 7 is a diagram showing a comparative example of the I/O characteristics of the gain stage based on simulation.

Here, in comparison to the I/O characteristics shown in FIG. 6(a), an example of changing the first and second conversion reference voltages $V_{RCH}$, $V_{RCL}$ supplied to the comparators 17a, 17b is shown in FIG. 7. In the example of the I/O characteristics shown in FIG. 6(a), the first and second conversion reference voltages $V_{RCH}$, $V_{RCL}$ were the values shown below:

$V_{RCH}=(3\ V_{RH}\ V_{RL})/4=1.75$ V; and $V_{RCL}=(V_{RH}+3\ V_{RL})/4=1.25$ V.

Meanwhile, in the example of the I/O characteristics shown in FIG. 7, the first and second conversion reference voltages $V_{RCH}$, $V_{RCL}$ are the values shown below:

$V_{RCH}=(5\ V_{RH}+3\ V_{RL})/8=1.625$ V; and $V_{RCL}=(3\ V+5\ V_{RL})/8=1.375$ V.

As shown in FIG. 7, when the first and second conversion reference voltages $V_{RCH}$, $V_{RCL}$ are changed, the integral A/D conversion in the gain stage 15 is not performed favorably. Accordingly, the first and second conversion reference voltages $V_{RCH}$, $V_{RCL}$ are preferably set to the values when the I/O characteristics of FIG. 6(a) are obtained.

Figure 8:
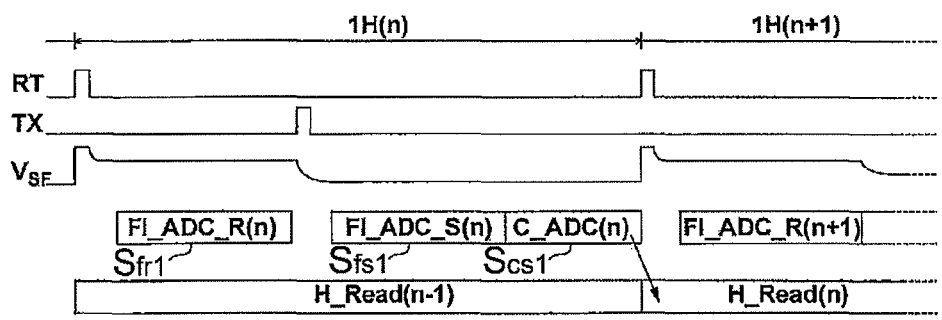
FIG. 8 is a diagram showing the processing timing in one horizontal reading period in the case of implementing analog CDS, and a diagram showing the processing timing in one horizontal reading period in the case of implementing digital CDS.
Figure 8:
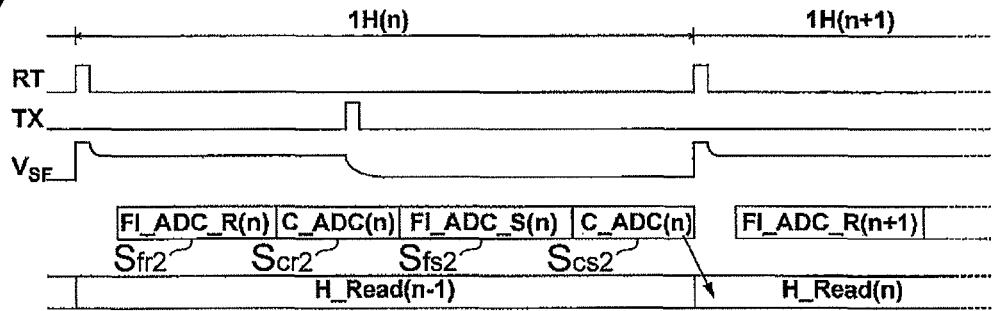

Depending on whether the correlative double sampling (CDS) to the signal from the image sensor cell is performed in an analog domain (analog CDS) or a digital domain (digital CDS), the input signal in the integral A/D conversion step, which is the so-called folding integral A/D conversion, will differ, and the method of implementing the cyclic A/D conversion to be performed after the integral A/D conversion will differ. FIG. 8(a) is a diagram showing the processing timing in one horizontal reading period in the case of performing analog CDS. Moreover, FIG. 8(b) is a diagram showing the processing timing in one horizontal reading period in the case of performing digital CDS.

As shown in FIG. 8(a), upon implementing analog CDS, integral A/D conversion is performed in the period $S_{fr1}$ by using, as the analog signal $V_{IN}$ to be input to the gain stage 15, a first signal which is output from the image sensor cell and indicates the reset level (first reset level integral A/D conversion step). Subsequently, integral A/D conversion is performed in the period $S_{fs1}$ by using, as the analog signal $V_{IN}$ to be input to the gain stage 15, a second signal which indicates a signal level that was superimposed on the reset level (first signal level integral A/D conversion step). In the first signal level integral A/D conversion step, as explained later with reference to FIG. 9, operation is performed such that the polarity of the electric charge to be transferred to the third capacitor 29 as an integrator becomes inverted from the first reset level integral A/D conversion step. Consequently, a value of a higher bit can be obtained in the digital value that is obtained as a result of the signal level being subject to A/D conversion. In the digital value obtained in the foregoing case, noise is cancelled. In addition, cyclic A/D conversion is performed in the period $S_{cs1}$ by using, as the input signal, the residual analog signal that is obtained as a result of the first signal level integral A/D conversion step. Consequently, a value of a lower bit can be obtained in the digital value that is obtained as a result of the signal level being subject to A/D conversion.

Moreover, as shown in FIG. 8(b), upon implementing digital CDS, integral A/D conversion is performed in the period $S_{fr2}$ by using, as the analog signal $V_{IN}$ to be input to the gain stage 15, a first signal which was output from the image sensor cell and indicates the reset level (first signal integral A/D conversion step). Consequently, a value of a higher bit can be obtained in the digital value that is obtained as a result of the reset level being subject to A/D conversion. Subsequently, cyclic A/D conversion is performed in the period $S_{cr2}$ by using, as the input signal, the residual analog signal that is obtained as a result of the first signal integral A/D conversion step (first signal cyclic A/D conversion step). Consequently, a value of a lower bit can be obtained in the digital value that is obtained as a result of the reset level being subject to A/D conversion. Accordingly, digital values as a result of the reset level being subject to A/D conversion are obtained in the period $S_{fr2}$ and the period $S_{cr2}$.

Subsequently, integral A/D conversion is performed in the period $S_{fs2}$ by using, as the analog signal $V_{IN}$ to be input to the gain stage 15, a second signal which indicates the signal level that was superimposed on the reset level (second signal integral A/D conversion step). Consequently, a value of a higher bit can be obtained in the digital value that is obtained as a result of the second signal being subject to A/D conversion. In addition, cyclic A/D conversion is performed in the period $S_{cs2}$ by using, as the input signal, the residual analog signal that is obtained as a result of the second signal integral A/D conversion step. Consequently, a value of a lower bit can be obtained in the digital value that is obtained as a result of the second signal being subject to A/D conversion. Accordingly, digital values as a result of the reset level being subject to A/D conversion are obtained in the period $S_{fs2}$ and the period $S_{cs2}$. Accordingly, digital values as a result of the second signal being subject to A/D conversion are obtained in the period $S_{fs2}$ and the period $S_{cs2}$. In addition, as a result of subtracting the digital values obtained in the period $S_{fr2}$ and the period $S_{cr2}$ from the digital values obtained in the period $S_{fs2}$ and the period $S_{cs2}$, it is possible to obtain a digital value of a signal level in which the output variation between cells and noise have been cancelled.

Figure 9:
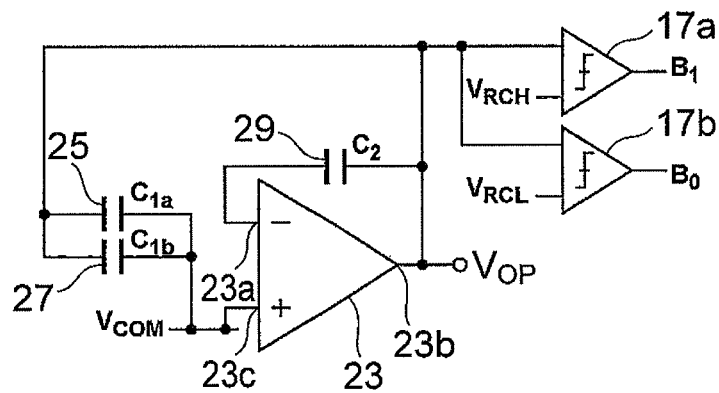
FIG. 9 is a diagram showing the operation of cyclic A/D conversion in the A/D converter shown in FIG. 1.
Figure 9:
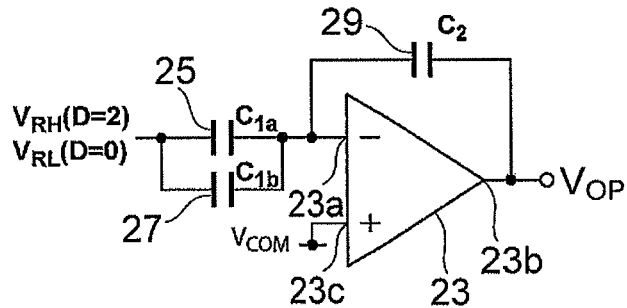
Figure 9:
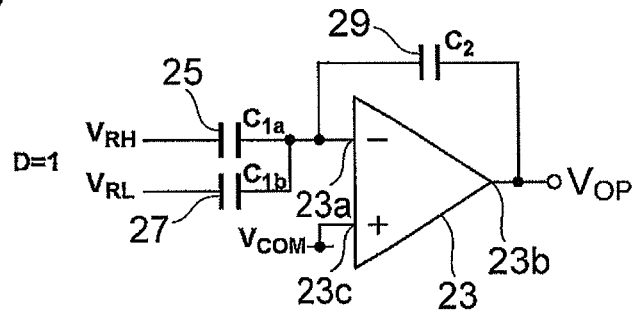

The operation of cyclic A/D conversion as the cyclic A/D conversion step in the A/D converter 11 is now explained with reference to FIG. 9. This cyclic A/D conversion is performed, for example, in the periods $S_{cs1}$, $S_{cr2}$, $S_{cs2}$ in FIG. 8.

Foremost, the gain stage 15 performs a second storage operation as a second initial storage step as shown in FIG. 9(a). In this step, the residual analog signal as the operation value $V_{OP}$ in the first signal level integral A/D conversion step (period $S_{fs1}$) or the integral A/D conversion step (period $S_{fr2}$ or period $S_{fs2}$) is stored in the first, second and third capacitors 25, 27, 29. In this step, the switches 31c, 47, 51 are caused to be conducting and the switches 31a, 31b, 43, 49, 53 are caused to be non-conducting based on the control signals ($\phi_{DH}=0$, $\phi_{DS}=1$, $\phi_{DL}=0$) and the clock signals ($\phi_1=1$, $\phi_2=0$, $\phi_3=1$, $\phi_R=0$, $\phi_S=0$). Moreover, in this step, the operation value $V_{OP}$ in the first signal level integral A/D conversion step or the integral A/D conversion step is provided to the comparators 17a, 17b. The comparators 17a, 17b generate the digital signals B1, $B_0$ based on the provided operation value $V_{OP}$.

Next, subsequent to the second initial storage step, the gain stage 15 performs a second arithmetic operation as a second arithmetic step shown in FIG. 9(b) or FIG. 9(c) according to the value of D (=$B_1+B_0$). In the second arithmetic operation, the gain stage 15 generates the operation value $V_{OP}$ with the operational amplifier circuit 23 and the capacitors 25, 27, 29. In the second arithmetic operation, the third capacitor 29 is connected between the output 15b and the input 15a of the operational amplifier circuit 15, the first capacitor 25 is connected between the first output 21a and the first input 23a, and the second capacitor 27 is connected between the second output 21b and the first input 23a. In the second arithmetic step, the switch 49 is caused to be conducting and the switches 47, 51, 53, 43 are caused to be non-conducting based on the clock signals ($\phi_1=0$, $\phi_2=1$, $\phi_3=0$, $\phi_R=0$, $\phi_S=0$).

The first standard reference voltage $V_{RH}$ or the second standard reference voltage $V_{RL}$ is provided to the first output 21a and the second output 21b of the D/A conversion circuit 21 based on the control of the switch circuit 31 according to the output value D (=$B_1+B_0$) from the comparators 17a, 17b.

The comparators 17a, 17b perform operations as follows:

when $V_{OP} > V_{RCH}$, $D=2$ ($B_1=1$, $B_0=1$);

when $V_{RCL} < V_{OP} \leq V_{RCH}$, $D=1$ ($B_1=0$, $B_0=1$); and when $V_{OP} \leq V_{RCL}$, $D=0$ ($B_1=0$, $B_0=0$).

When D=2, the operation of FIG. 9(b) is performed while control is carried out such that the first standard reference voltage $V_{RH}$ is provided from the first output 21a and the second output 21b of the D/A conversion circuit 21. Meanwhile, when D=0, the operation of FIG. 9(b) is performed while control is carried out such that the second standard reference voltage $V_R$, is provided from the first output 21a and the second output 21b of the D/A conversion circuit 21. In addition, when D=1, the operation of FIG. 9(c) is performed while control is carried out such that the first standard reference voltage $V_{RH}$ and the second standard reference voltage $V_{RL}$ are respectively provided from the first output 21a and the second output 21b of the D/A conversion circuit 21.

Next, subsequent to the second arithmetic step, the gain stage 15 performs a second storage operation as a second storage step shown in FIG. 9(a).

The second storage step differs from the second initial storage step with respect to the point that the operation value $V_{OP}$ in the second arithmetic step is stored in the first, second and third capacitors 25, 27, 29.

In addition, the gain stage 15 performs the cyclic A/D conversion step by repeating the second arithmetic step and the second storage step a predetermined number of times.

Figure 10:
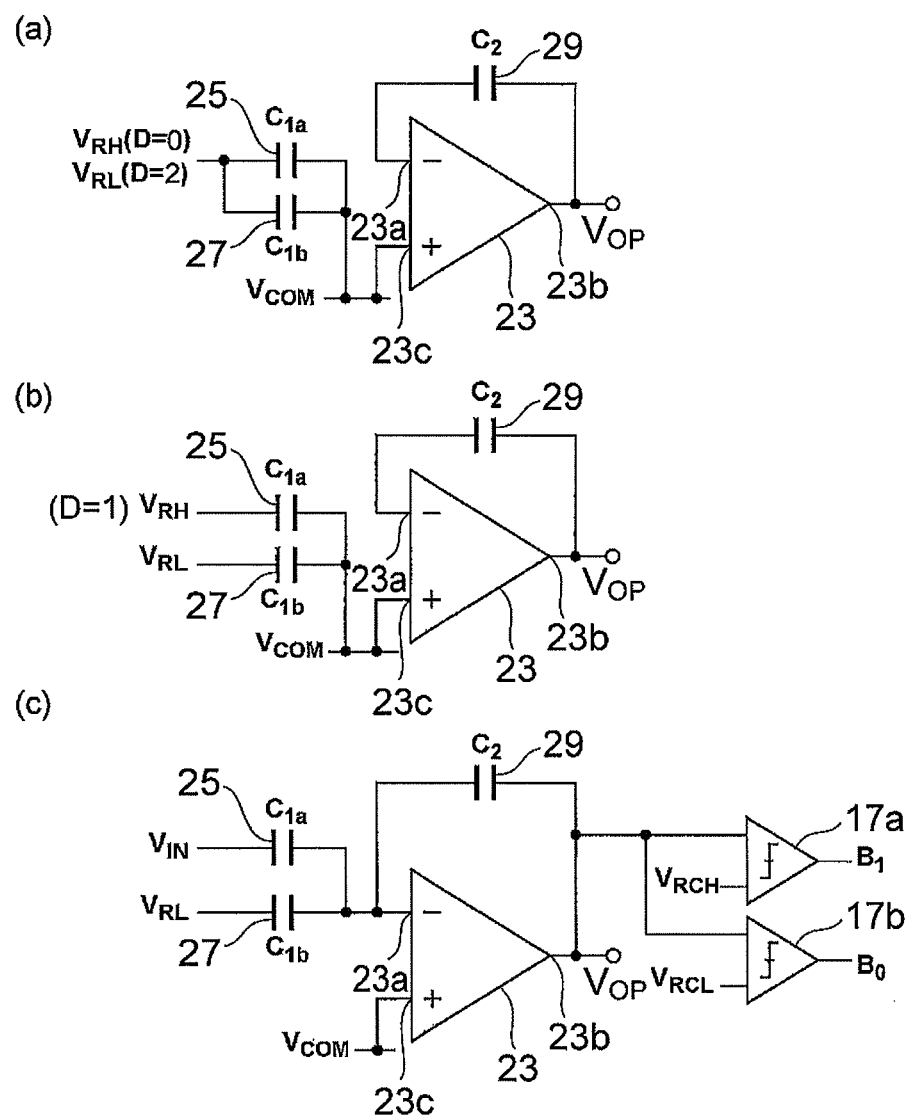
FIG. 10 is a diagram showing the operation of integral A/D conversion in the A/D converter shown in FIG. 1.

The integral A/D conversion operation is performed, for instance, in the period $S_{fs1}$ in FIG. 8(a) is now explained with reference to FIG. 10. FIG. 10 shows an example of the integral A/D conversion operation performed to the second signal which indicates the signal level that was superimposed on the reset level in case of implementing analog CDS as explained above. In other words, the A/D conversion operation is performed such that the polarity of the electric charge to be transferred to the capacitor configuring an integrator becomes inverted from the integral A/D conversion (refer to FIG. 5) which was performed to the first signal indicating the reset level.

Foremost, the gain stage 15 causes the A/D converter 11 to perform a first storage operation as a first signal level storage step shown in FIG. 10(a) or FIG. 10(b) according to the value of the output value D in the arithmetic operation of the preceding step. In this step, the gain stage 15 stores the first standard reference voltage $V_{RH}$ or the second standard reference voltage $V_{RL}$ supplied from the first output 21a in the first capacitor 25 and stores the first standard reference voltage $V_{RH}$ or the second standard reference voltage $V_{RL}$ supplied from the second output 21b in the second capacitor 27 while retaining, in the capacity $C_2$, the operation value $V_{OP}$ in the first reset level integral A/D conversion step by connecting the third capacitor 29 between the output 23b and the first input 23a of the operational amplifier circuit 23.

When D=2, the operation of FIG. 10(a) is performed while control is carried out such that the second standard reference voltage $V_{RL}$ is provided from the first output 21a and the second output 21b of the D/A conversion circuit 21. Meanwhile, when D=0, the operation of FIG. 10(a) is performed while control is carried out such that the first standard reference voltage $V_{RH}$ is provided from the first output 21a and the second output 21b of the D/A conversion circuit 21. In addition, when D=1, the operation of FIG. 10(b) is performed while control is carried out such that the first standard reference voltage $V_{RH}$ and the second standard reference voltage $V_{RL}$ are respectively provided from the first output 21a and the second output 21b of the D/A conversion circuit 21.

Subsequently, the gain stage 15 performs a first arithmetic operation as a first signal level arithmetic step shown in FIG. 10(c). In this step, the gain stage 15 connects the first capacitor 25 between the input $V_{IN}$ and the first input 23a of the gain stage 15 to which the second signal has been supplied, and connects the second capacitor 27 between the second output 21b and the first input 23a.

Since the analog signal $V_{IN}$ and the reference voltage $V_{RI}$ in the operational amplifier circuit 23 are supplied to the first and second capacitors 25, 27 after the first or second standard reference voltage is supplied to the first and second capacitors 25, 27, the electric charge related to the analog signal $V_{IN}$ is transferred to the integrator in polarity that is inverted from the integral A/D conversion shown in FIG. 5.

When the reference voltage $V_{RI}$ in the operational amplifier circuit 23 is ($V_{RI}=V_{RL}$), the operation value $V_{OP}$ (M+1) in the foregoing case is expressed as shown in Formula (9) below.

$$V_{OP}(M+1) = V_{OP}(M) - \frac{1}{2}(V_{IN} - V_{RL}) + \Delta V_R D(M+1) \qquad (9)$$

In addition, the operation value $V_{OP}$ (2M) upon repeating the first signal level arithmetic step and the first signal level storage step M times is expressed as shown in Formula (10) below.

$$V_{OP}(2M) = V_{OP}(M) - \frac{M}{2}(V_{IN} - V_{RL}) + \Delta V_R \sum_{i=1}^{M} D(M+i) \qquad (10)$$

Moreover, when $V_{RI}=V_{RH}$, Formula (10) is modified as shown in Formula (11) below.

$$V_{OP}(2M) = V_{OP}(M) - \frac{M}{2}(V_{IN} - V_{RH}) + \Delta V_R \sum_{i=1}^{M} (D(M+i) - 1) \qquad (11)$$

Moreover, since the analog signal $V_{IN}$ provided to the input 15a of the gain stage 15 is the signal $V_{RES}$ of the reset level in the first reset level integral A/D conversion step (1 to M-th sampling and integration), and the analog signal $V_{IN}$ provided to the input 15a of the gain stage 15 is the signal $V_{SIG}$ of the signal level in the first signal level integral A/D conversion step (M+1 to 2M-th sampling and integration), Formula (10) is expressed as shown in Formula (12) below.

$$V_{OP}(2M) = \qquad (12)$$
$$V_{COM} + \frac{M}{2}(V_{RES} - V_{SIG}) + \Delta V_R \left( \sum_{i=1}^{M} D(M+i) - \sum_{i=1}^{M} D(i) \right)$$

In addition, Formula (12) is expressed as shown in Formula (13) below.

$$\frac{M(V_{RES} - V_{SIG})}{2\Delta V_R} = \frac{V_{OP}(2M) - V_{COM}}{\Delta V_R} + \left( \sum_{i=1}^{M} D(i) - \sum_{i=1}^{M} D(M+i) \right) \qquad (13)$$

In addition, Formula (13) is expressed as shown in Formula (14) below by using Formula (6).

$$\frac{M(V_{RES} - V_{SIG})}{V_{RH} - V_{RL}} = 2\frac{V_{OP}(2M) - V_{COM}}{V_{RH} - V_{RL}} + \left( \sum_{i=1}^{M} D(i) - \sum_{i=1}^{M} D(M+i) \right) \qquad (14)$$

As a result of performing an m-bit cyclic A/D conversion to $V_{OP}$ (2M) on the right side of Formula (14), ($V_{OP}$ (2M)−$V_{COM}$)/($V_{RH}$−$V_{RL}$) in the first term on the right side of Formula (14) is converted into a digital value which takes on a value from −0.5 to 0.5. With this digital value as X, this is expressed as shown in Formula (15) below.

$$X = \left[\frac{V_{OP}(2M) - V_{COM}}{V_{RH} - V_{RL}}\right] \quad (15)$$

Here, the brackets [ ] mean the digital value of the value in the brackets.

In addition, value Y is expressed as shown in Formula (16) below.

$$Y = \left[\frac{V_{RES} - V_{SIG}}{V_{RH} - V_{RL}}\right] \quad (16)$$

Formula (14) is expressed as shown in Formula (17) by using values X, Y.

$$Y = 2\frac{X}{M} + \frac{1}{M}\left(\sum_{i=1}^{M} D(i) - \sum_{i=1}^{M} D(M+i)\right) \quad (17)$$

Formula (17) means that the digital value relative to the M ($V_{RES}$–$V_{SIG}$) to be obtained is expressed by the result of the cyclic A/D conversion and the result (digital count value) of the folding integral A/D conversion. If the result of the folding integral A/D conversion is n bits, the A/D converter 11 of this embodiment can perform A/D conversion capable of obtaining a digital value of (n+m−1) bits. Note that the digital count value, which is the result of the folding integral A/D conversion, can be obtained as a result of the counter circuit provided to the subsequent stage of the A/D conversion circuit 17 counting the number of times that 1 appeared in the output value D ($B_1$+$B_0$ or $B_1$). The acquisition of this count value will be described later.

Figure 11:
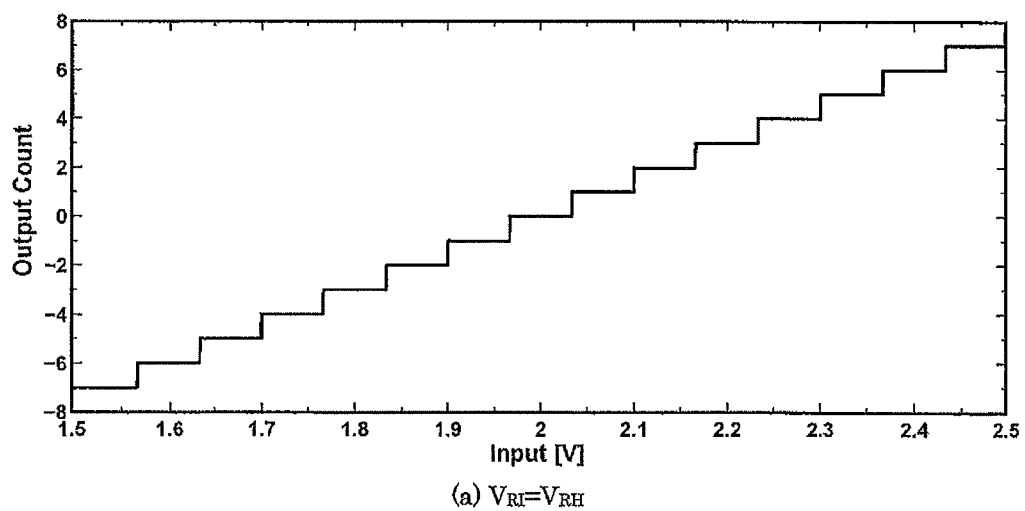
FIG. 11 is a diagram showing the relation of the input level and the digital count value of an analog signal $V_{IN}$, which is an input signal, corresponding to the simulation of FIG. 6.
Figure 11:
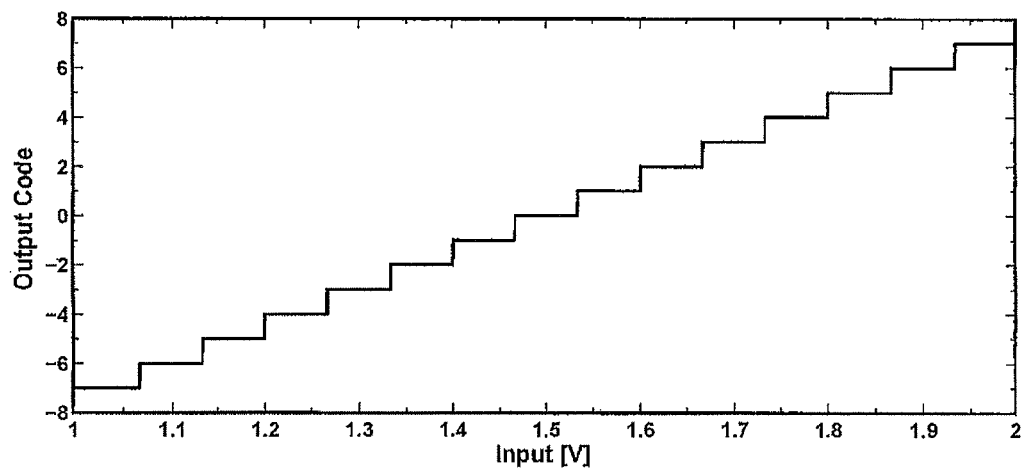

FIG. 11 is a diagram showing the relation of the input level and the digital count value of the analog signal $V_{IN}$, which is the input signal corresponding to the simulation of FIG. 6. As shown in FIGS. 11(a) and 11(b), the digital count value can take on a value of 15 gradients relative to the sampling and integration performed 16 times and the input range of 1.0 V in the integral A/D conversion. Accordingly, the range of this digital count value is expressed in approximately 4 bits.

The term of $$\left(\sum_{i=1}^{M} D(i) - \sum_{i=1}^{M} D(M+i)\right)$$

in Formula (13) is expressed as 4 bits since it can take on a value in the range of 0 to 14 when the range of the input level is 1.0 V. Accordingly, for example, when cyclic A/D conversion is performed so that a 12-bit output result can be obtained, since a linear signal is generated by shifting the high bit of the counter value by 1 bit, the A/D converter 11 of this embodiment can possess a dynamic range basically corresponding to 15 bits (=(12+4−1) bits). As explained above, the A/D converter 11 of this embodiment can output a digital signal having a broad dynamic range while sufficiently obtaining the noise reduction effect based on integral A/D conversion as folding integral A/D conversion.

Figure 12:
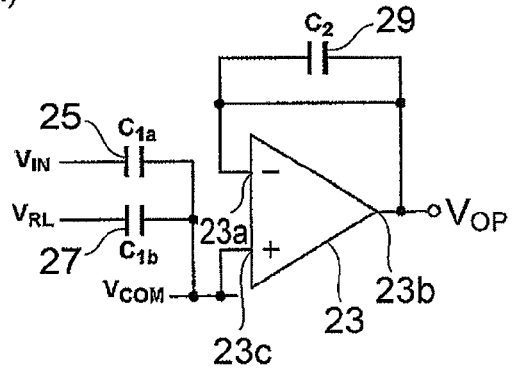
FIG. 12 is a diagram showing the operation of integral A/D conversion in an A/D converter.
Figure 12:
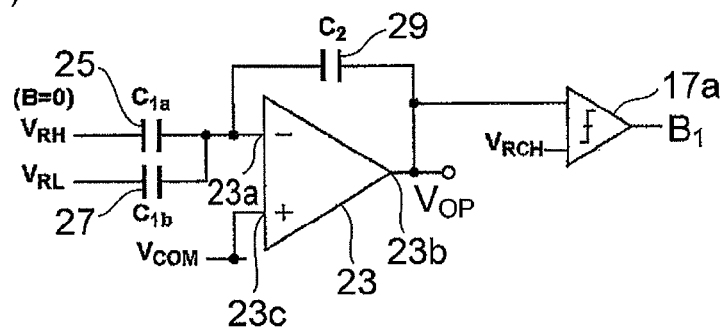
Figure 12:
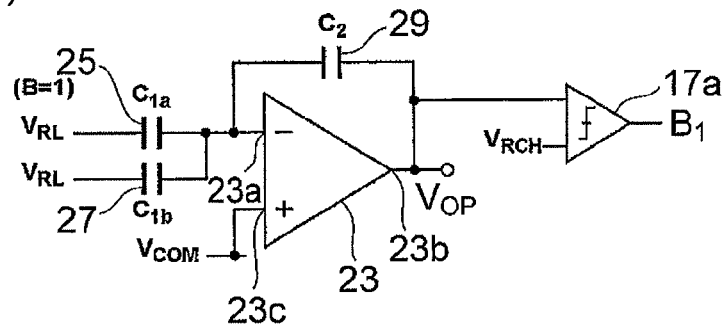
Figure 12:
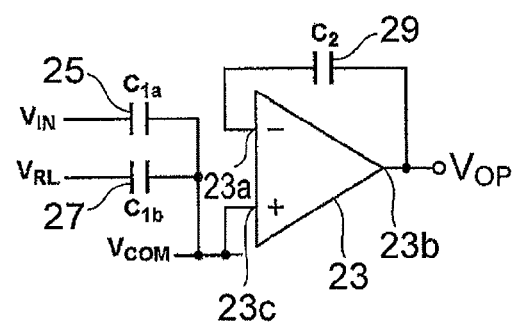

The first A/D conversion operation in the case of the A/D conversion circuit 17 using one comparator 17a to generate the digital signal D is now explained with reference to FIG. 12.

In FIG. 12(a), the gain stage 15 performs a first storage operation as a first initial storage step. In this step, the analog signal $V_{IN}$ that was received the input 15a of the gain stage 15 is stored in the first capacitor 25, and the output 23b and the first input 23a of the gain stage 15 are connected. Moreover, the second capacitor 27 stores the second standard reference voltage $V_{RL}$ supplied from the second output 21b, and the third capacitor 29 is connected between the output 23b and the first input 23a of the operational amplifier circuit 23.

The storage and connection in the first initial storage step and the respective steps explained below are realized by the switch circuit 31 and the switches 43, 47, 49, 51, 53. In the first initial storage step, the switches 31c, 47, 53, 43 are caused to be conducting and the switches 31a, 31b, 49, 51 are caused to be non-conducting based on the control signals ($\phi_{DH}$=0, $\phi_{DS}$=0, $\phi_{DL}$=1) and the clock signals ($\phi_1$=1, $\phi_2$=0, $\phi_3$=0, $\phi_R$=1, $\phi_S$=1).

Subsequent to the first initial storage step, the A/D converter 11 performs a first arithmetic operation as a first arithmetic step shown in FIG. 12(b) or FIG. 12(c) according to the value of D (=$B_1$).

In this step, the first arithmetic operation is performed upon connecting the first capacitor 25 between the first output 21a and the first input 23a. Moreover, the operation value $V_{OP}$ is generated in the output 15b of the gain stage 15 by the second capacitor 27 being connected between the second output 21b and the first input 23a, and the third capacitor 29 being connected between the output 23b and the first input 23a of the operational amplifier circuit 23. In the first arithmetic step, the switch 49 is caused to be conducting and the switches 47, 51, 53, 43 are caused to be non-conducting based on the clock signals ($\phi_1$=0, $\phi_2$=1, $\phi_3$=0, $\phi_R$=0, $\phi_S$=0).

The first standard reference voltage $V_{RH}$ or the second standard reference voltage $V_{RL}$ is provided to the first output 21a and the second output 21b of the D/A conversion circuit 21 based on the control of the switch circuit 31 according to the output value D (=$B_1$) from the comparator 17a.

The comparator 17a performs operations as follows:

when $V_{OP} > V_{RCH}$, $B_1$=1; and when $V_{OP} \leq V_{RCH}$, $B_1$=0.

When D=0 ($B_1$=0), the operation of FIG. 12(b) is performed while control is carried out such that the first standard reference voltage $V_{RH}$ and the second standard reference voltage $V_{RL}$ are respectively provided from the first output 21a and the second output 21b of the D/A conversion circuit 21. Meanwhile, when D=1, the operation of FIG. 12(b) is performed while control is carried out such that the second standard reference voltage $V_{RL}$ is provided from the first output 21a and the second output 21b of the D/A conversion circuit 21.

Subsequently, the gain stage 15 performs a first storage operation shown in FIG. 12(d) as a first storage step. In the first storage step, the analog signal $V_{IN}$ from the input 15a of the gain stage 15 is stored in the first capacitor 25 and the second standard reference voltage $V_{RL}$ supplied from the second output 21b is stored in the second capacitor 27, while retaining the operation value $V_{OP}$ in the capacity $C_2$, by connecting the third capacitor 29 between the output 23b and the first input 23a of the operational amplifier circuit 23. In the first storage step, the switches 31c, 47, 43 are caused to be conducting and the switches 31a, 31b, 49, 51, 53 are caused to be non-conducting based on the control signals ($\phi_{DH}$=0, $\phi_{DS}$=0, $\phi_{DL}$=1) and the clock signals ($\phi_1$=1, $\phi_2$=0, $\phi_3$=0, $\phi_R$=0, $\phi_S$=1).

Subsequently, while selecting the first arithmetic operation shown in either FIG. 12(b) or FIG. 12(c) according to the value of the output value D, the gain stage 15 performs an integral A/D conversion step of repeating the first arithmetic step and the first storage step a predetermined number of times.

Figure 13:
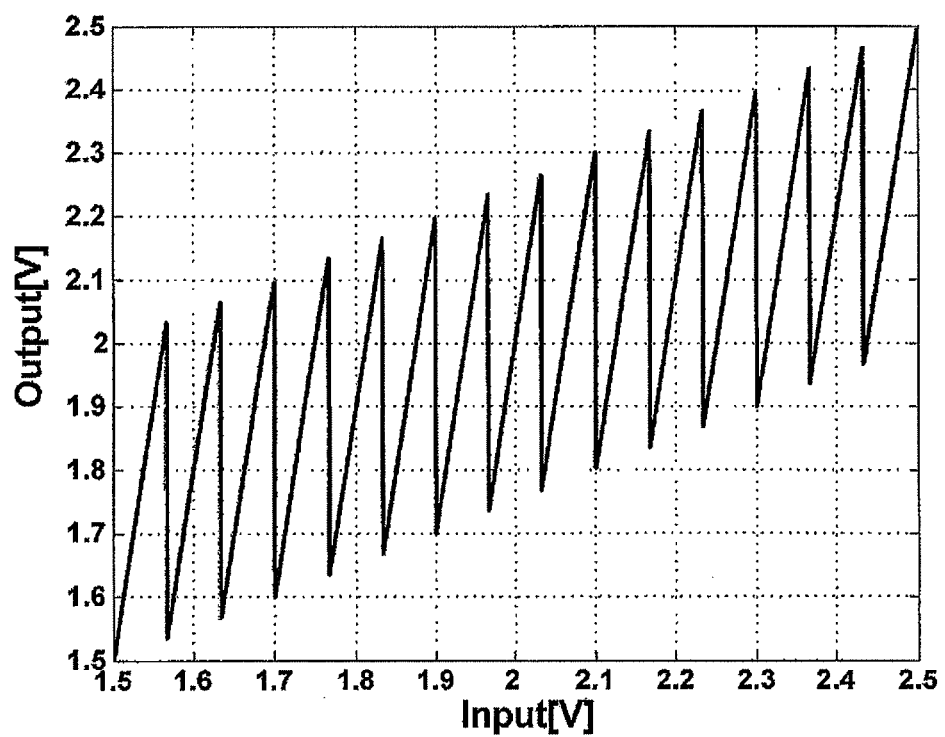
FIG. 13 is a diagram showing the I/O characteristics of the gain stage based on simulation in the operation of integral A/D conversion shown in FIG. 12.

FIG. 13 is a diagram showing the I/O characteristics during the operation (folding integral A/D conversion) as the integral A/D converter of the gain stage 15 that was obtained based on simulation in a case where the A/D conversion circuit 17 uses one comparator 17a to generate the digital signal D. The conditions in this simulation are ($V_{RH}$=2.5 V, $V_{RL}$=1.5 V, reference voltage $V_{RI}$=$V_{RL}$ in the arithmetic operation, $V_{COM}$=2.0 V, sampling and integration frequency M=16). As shown in FIG. 13, the output is 1.5 to 2.5 V relative to the input of the amplitude 1 V of 1.5 to 2.5 V, and the amplitude is contained with the range of 1 V.

Figure 14:
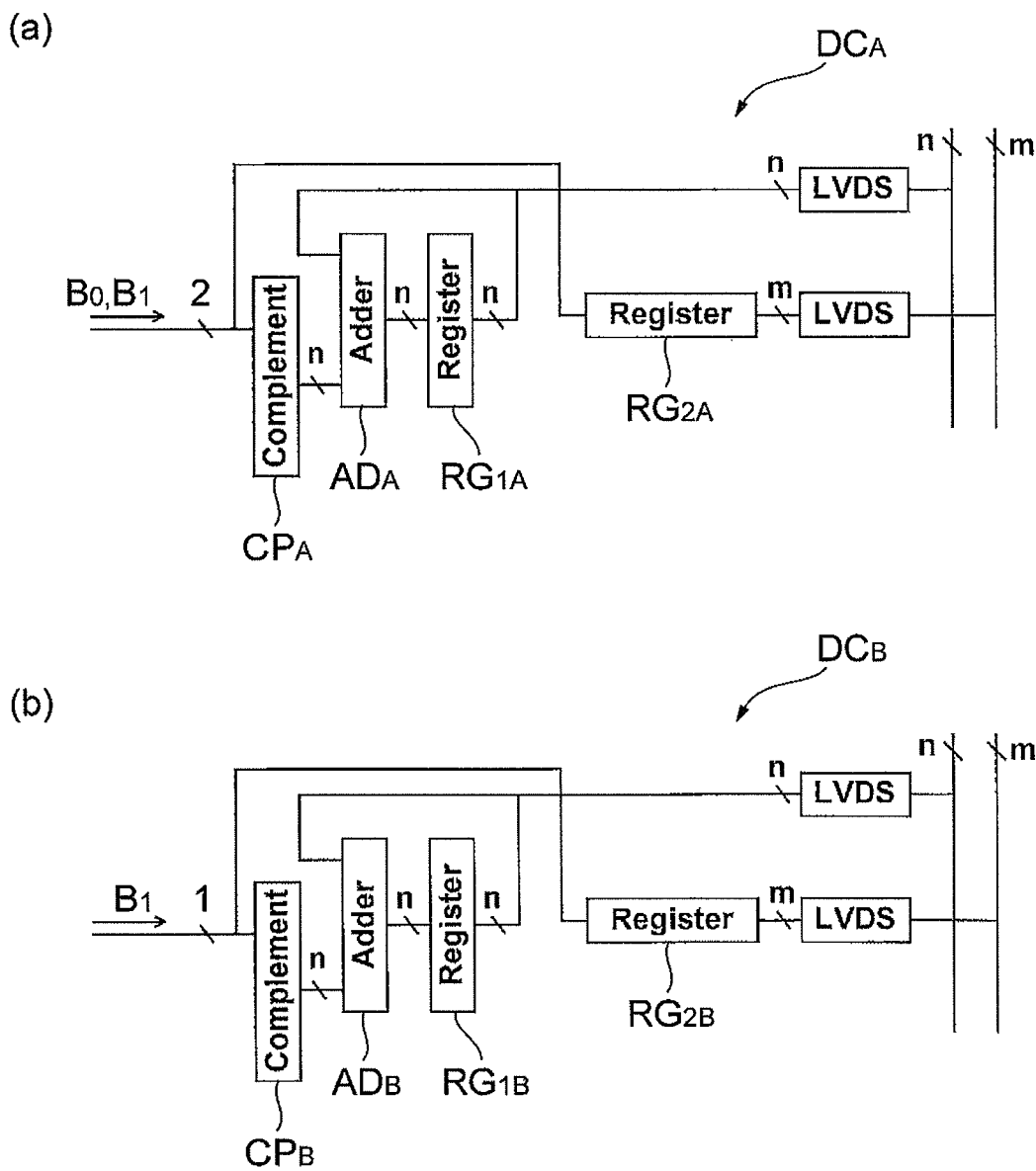
FIG. 14 is a block diagram showing the configuration for generating a digital value from an output signal of a comparator.
Figure 15:
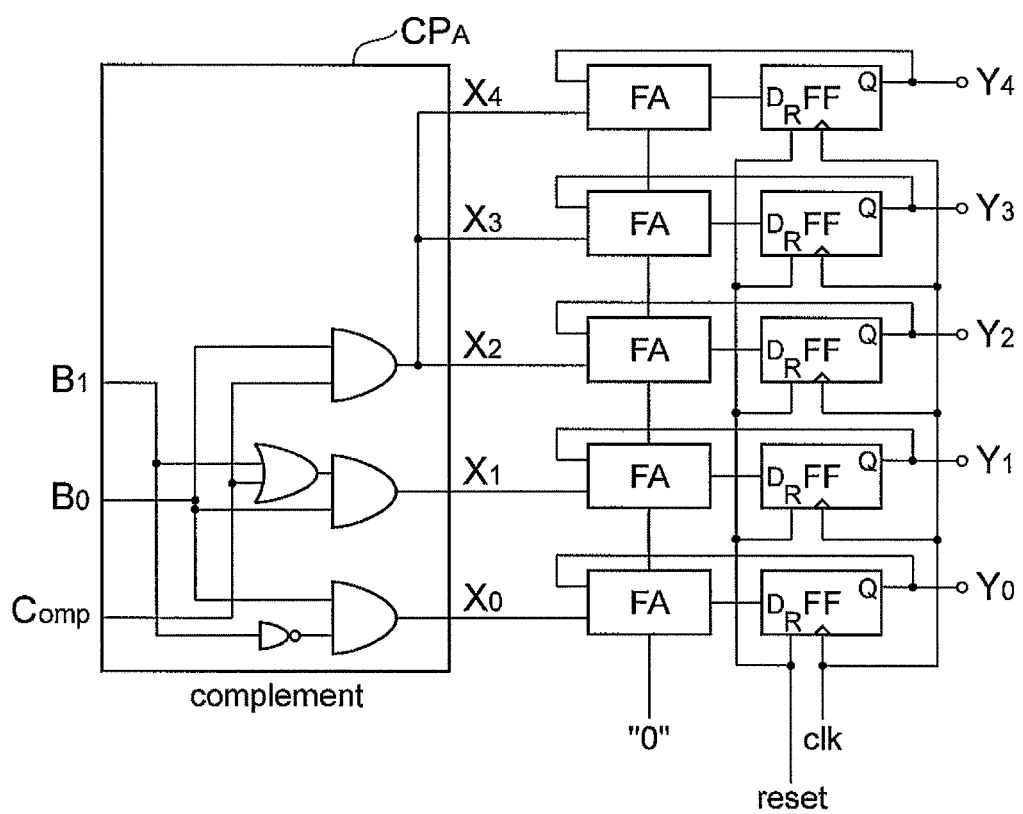
FIG. 15 is a circuit diagram of a part of the configuration shown in FIG. 14.
Figure 16:
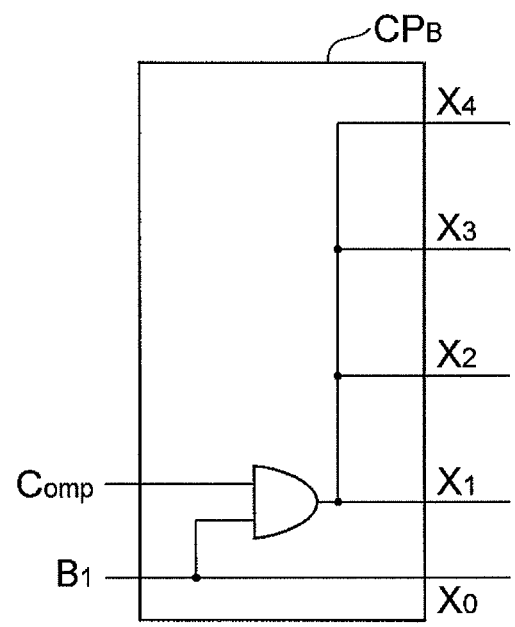
FIG. 16 is a circuit diagram of a part of the configuration shown in FIG. 14.

The configuration of the digital unit DC for generating a digital value as a result of the A/D conversion based on the output value D of the folding integral A/D conversion, which is the first A/D conversion operation, is now explained with reference to FIGS. 14 to 16. FIG. 14(a) is a diagram showing the digital unit $DC_A$ in cases where the A/D conversion circuit 17 uses two comparators 17a, 17b and two conversion reference voltages $V_{RCH}$, $V_{RCL}$ for generating the digital signal D. The digital unit $DC_A$ includes a complement unit $CP_A$, an adder $AD_A$, a register $RG_{1A}$ and a register $RG_{2A}$. Moreover, FIG. 15 is a diagram showing the detailed configuration of the complement unit $CP_A$, the adder $AD_A$, and the register $RG_{1A}$ shown in FIG. 14(a). With the example shown in FIG. 15, a 5-bit digital value can be obtained. The operation of these configurations is now explained with reference to FIG. 14(a) and FIG. 15.

Foremost, a reset signal reset is provided to a 5-bit register $RG_{1A}$ (configured from five flip flops FF), and the outputs thereof are set to 0. For each cycle of integration in the integral A/D conversion, the output of the register $RG_{1A}$ and the 2-bit output (B1, B0) from the two comparators 17a, 17b of integral A/D conversion are added by the adder $AD_A$ (configured from five full adders FA), a clock is further added thereto, and the output result is stored in the register $RG_{1A}$. As a result of repeating the foregoing adding and storage, the 2-bit output is subject to digital integration. Upon implementing A/D conversion of a first signal indicating the reset level, the signal Comp provided to the complement unit $CP_A$ is set to 0. Consequently, the output of the complement unit $CP_A$ becomes, ($X_2$=0, $X_3$=0, $X_4$=0). In addition, when the input is ($B_0$=0, $B_1$=0), since the output becomes ($X_0$=0, $X_1$=0), the addition of values is not performed. Moreover, when the input is ($B_0$=1, $B_1$=0), since the output becomes ($X_0$=1, $X_1$=0), the value is added one at a time. In addition, when the input is ($B_0$=1, $B_1$=1), since the output becomes ($X_0$=0, $X_1$=1), the value is added two at a time.

Meanwhile, upon implementing A/D conversion of a second signal indicating the signal level, the signal Comp provided to the complement unit $CP_A$ is set to 1. Consequently, the output of the complement unit $CP_A$ becomes ($X_2$=1, $X_3$=1, $X_4$=1). In addition, when the input is ($B_0$=0, $B_1$=0), since the output becomes (X0=0, $X_1$=0, $X_2$=0, $X_3$=0, $X_4$=0), the addition of values is not performed. Moreover, when the input is ($B_0$=1, $B_1$=0), since the output becomes (X0=1, $X_1$=1, $X_2$=1, $X_3$=1, $X_4$=1), if this is considered as the complement of 2, the value is added −1 at a time. In addition, when the input is ($B_0$=1, $B_1$=1), since the output becomes (X0=0, $X_1$=1, $X_2$=1, $X_3$=1, $X_4$=1), if this is considered as the complement of 2, the value is added −2 at a time.

Based on the foregoing configuration, the number of times that the reference voltage is restored is counted each time integration is repeated to the reset level and the signal level, respectively, and the frequency corresponding to the difference between the two is ultimately stored in the register $RG_{1A}$. In other words, this kind of configuration can be adopted for the acquisition of a digital value based on digital CDS as explained with reference to FIG. 8(b). Note that the register $RG_{2A}$ stores the digital value that is obtained as a result of cyclic A/D conversion.

FIG. 14(b) is a diagram showing the digital unit $DC_B$ in cases where the A/D conversion circuit 17 uses one comparator 17a and one conversion reference voltage $V_{RCH}$ for generating the digital signal D. The digital unit $DC_B$ includes a complement unit $CP_B$, an adder $AD_B$, a register $RG_{1B}$ and a register $RG_{2B}$. Moreover, FIG. 16 is a diagram showing the detailed configuration of the complement unit $CP_B$ shown in FIG. 14(b). Note that the configuration of the adder $AD_B$ and the register $RG_{1B}$ is the same as the configuration shown in FIG. 15. In the example shown in FIG. 16, a 5-bit digital value is obtained. The operation of these configurations is now explained with reference to FIG. 14(b) and FIG. 16.

Foremost, a reset signal reset is provided to a 5-bit register $RG_{1B}$ (configured from five flip flops FF), and the outputs thereof are set to 0. For each cycle of integration in the integral A/D conversion, the output of the register $RG_{1B}$ and the 1-bit output (B1) from one comparator 17a of integral A/D conversion are added by the adder $AD_B$ (configured from five full adders FA), a clock is further added thereto, and the output result is stored in the register $RG_{1B}$. As a result of repeating the foregoing adding and storage, the 1-bit output is subject to digital integration. Upon implementing A/D conversion of a first signal indicating the reset level, the signal Comp provided to the complement unit $CP_B$ is set to 0. Consequently, the output of the complement unit $CP_B$ becomes, ($X_1$=0, $X_2$=0, $X_3$=0, $X_4$=0). In addition, when the input is ($B_1$=0), since the output becomes ($X_0$=0), the addition of values is not performed. Moreover, when the input is ($B_1$=1), since the output becomes ($X_0$=1), the value is added one at a time.

Meanwhile, upon implementing A/D conversion of a second signal indicating the signal level, the signal Comp provided to the complement unit $CP_B$ is set to 1. Consequently, the output of the complement unit $CP_B$ becomes ($X_1$=0, $X_2$=1, $X_3$=1, $X_4$=1). In addition, when the input is ($B_1$=0), since the output becomes (X0=0, $X_1$=0, $X_2$=0, $X_3$=0, $X_4$=0), the addition of values is not performed. Moreover, when the input is ($B_1$=1), since the output becomes (X0=1, $X_1$=1, $X_2$=1, $X_3$=1, $X_4$=1), if this is considered as the complement of 2, the value is added −1 at a time.

Based on the foregoing configuration, the number of times that the reference voltage is restored is counted each time integration is repeated to the reset level and the signal level, respectively, and the frequency corresponding to the difference between the two is ultimately stored in the register $RG_{1B}$. In other words, this kind of configuration can be adopted for the acquisition of a digital value based on digital CDS as explained with reference to FIG. 8(b). Note that the register $RG_{2B}$ stores the digital value that is obtained as a result of cyclic A/D conversion.

According to the A/D converter 11 of this embodiment explained above, by performing control of operational procedures in a same circuit configuration, a first A/D conversion operation for performing a folding integral A/D conversion and a second A/D conversion operation for performing a cyclic A/D conversion are realized. Moreover, in the first A/D conversion operation, since the capacity of the third capacitor 29 used in the integration of an output signal is greater than the capacity of the first and second capacitors 25, 27 used for storing the analog signal and the standard reference voltage to be subject to A/D conversion, the analog signal $V_{IN}$ that is input in the folding integral A/D conversion is attenuated according to the capacity ratio and subject to sampling and integration. Consequently, the voltage range of the analog signal that is output in the folding integral A/D conversion also decreases according to the capacity ratio of the capacitors, and the A/D converter can be therefore constructed with a single-ended configuration.

The present invention was explained in detail above based on its embodiment. Nevertheless, the present invention is not limited to the foregoing embodiment. The present invention may be variously modified to the extent that such modification does not deviate from the gist of this invention.

INDUSTRIAL APPLICABILITY

As explained above, according to this embodiment, it is possible to realize, with a single-ended configuration, an A/D converter which performs A/D conversion based on folding integration and cyclic A/D conversion of a residual analog signal thereof.

REFERENCE SIGNS LIST $B_1$, $B_0$ . . . digital signal, $C_{1a}$, $C_{1b}$, $C_2$ . . . capacity, D . . . digital signal, SA . . . switch, SI . . . switch, $V_{COM}$ . . . reference potential, $V_{CONT}$ . . . control signal, $V_{IN}$ . . . analog signal, $V_{OP}$ . . . operation value, $V_{RCH}$ . . . first conversion reference voltage, $V_{RCL}$ . . . second conversion reference voltage, $V_{RH}$ . . . first standard reference voltage, $V_{RL}$ . . . second standard reference voltage, 31a to 31c . . . switch, 2a . . . image sensor cell, 11 . . . D/A converter, 15 . . . gain stage, 15a . . . input, 15b . . . output, 17 . . . A/D conversion circuit, 17a, 17b . . . comparator, 19 . . . logical circuit, 21 . . . D/A conversion circuit, 21a . . . first output, 21b . . . second output, 23 . . . operational amplifier circuit, 23a . . . first input, 23b . . . output, 23c . . . second input, 25 . . . first capacitor, 27 . . . second capacitor, 29 . . . third capacitor, 31 . . . switch circuit, 31a, 31b, 31c, 43, 49, 51, 53 . . . switch, 33, 35 . . . reference voltage source, 37 . . . reference voltage generation circuit, 41 . . . clock generator

The invention claimed is:

1. A single-ended A/D converter, comprising:

a gain stage which includes an input for receiving an analog signal to be converted into a digital value, an output, and an operational amplifier circuit having a first input, a second input and an output;

an A/D conversion circuit which refers to a conversion reference voltage and generates a digital signal including one or more bits based on a signal from the output of the gain stage;

a logical circuit which generates a control signal according to the digital signal; and a D/A conversion circuit which has first and second outputs, and provides at least a first standard reference voltage or a second standard reference voltage to the gain stage via the first and second outputs in accordance with the control signal, wherein the gain stage includes first to third capacitors, a capacity of the third capacitor is greater than capacities of the first and second capacitors, the second input of the operational amplifier circuit receives a reference potential, the first standard reference voltage is higher than the second standard reference voltage value, the D/A conversion circuit includes a switch circuit for providing either the first or second standard reference voltage to the first output and providing either the first or second standard reference voltage to the second output in response to the control signal, the A/D converter performs a first A/D conversion operation and a second A/D conversion operation, in the first A/D conversion operation, the gain stage performs a first arithmetic operation of generating an operation value with the operational amplifier circuit and the first to third capacitors, and a first storage operation, in the first storage operation, the first capacitor is connected between the input of the gain stage and the second input of the operational amplifier, and stores a first or second standard reference voltage supplied from the first output, or the analog signal, the second capacitor is connected between the second output of the D/A conversion circuit and the second input of the operational amplifier, and stores a first or second standard reference voltage supplied from the second output, the third capacitor is connected between the output and the first input of the operational amplifier circuit, in the first arithmetic operation, when the first or second standard reference voltage is stored in the first capacitor in the first storage operation, the first capacitor is connected between the input to receive the analog signal and the first input, and when the analog signal is stored in the first capacitor in the first storage operation, the first capacitor is connected between the first output and the first input, the second capacitor is connected between the second output and the first input, the operation value is generated in the output of the gain stage by the third capacitor being connected between the output and the first input of the operational amplifier circuit, in the second A/D conversion operation, the gain stage performs a second arithmetic operation of generating an operation value with the operational amplifier circuit and the first to third capacitors, and a second storage operation of storing the operation value in the first and second capacitors, and in the second arithmetic operation, the operation value is generated in the output of the gain stage by the third capacitor being connected between the output and the first input of the operational amplifier circuit, and the first and second capacitors being respectively connected between the first or second output and the first input of the D/A conversion circuit.

2. The A/D converter according to claim 1, wherein the third capacitor has a capacity that is double the capacity of the first or second capacitor.

3. The A/D converter according to claim 1, wherein the A/D conversion circuit includes first and second conversion reference voltages, the first conversion reference voltage is higher than a median between the first standard reference voltage and the second standard reference voltage value and lower than the first standard reference voltage, the first conversion reference voltage in the first A/D conversion operation is higher than the first conversion reference voltage in the second A/D conversion operation, the second conversion reference voltage is lower than the median and higher than the second standard reference voltage, the second conversion reference voltage in the first A/D conversion operation is lower than the second conversion reference voltage in the second A/D conversion operation, the A/D conversion circuit generates a ternary digital signal, and the logical circuit generates a control signal including first to third values.

4. The A/D converter according to claim 3, wherein when the first standard reference voltage is represented by $V_{RH}$ and the second standard reference voltage is represented by $V_{RL}$, the first conversion reference voltage $V_{RC1H}$ and the second conversion reference voltage $V_{RC1L}$ in the first A/D conversion operation are respectively expressed by the following formulae:

$$V_{RC1H}=(3\ V_{RH}+V_{RL})/4;\ and$$

$$V_{RC1L}=(V_{RH}+3\ V_{RL})/4, and$$

the first conversion reference voltage $V_{RC2H}$ and the second conversion reference voltage $V_{RC2L}$ in the second A/D conversion operation are respectively expressed by the following formulae:

$$V_{RC2H}=(5\ V_{RH}+3\ V_{RL})/8;\ and$$

$$V_{RC2L}=(3\ V_{RH}+5\ V_{RL})/8.$$

5. The A/D converter according to claim 1, wherein the conversion reference voltage in the first A/D conversion operation is a median between the first standard reference voltage and the second standard reference voltage value, the A/D conversion circuit generates a 1-bit digital signal, and the logical circuit generates a control signal having first and second values.

6. The A/D converter according to claim 5, wherein a first conversion reference voltage $V_{RC2H}$ and a second conversion reference voltage $V_{RC2L}$ referred to in the second A/D conversion operation are respectively expressed by the following formulae:

$$V_{RC2H}=(5\ V_{RH}+3\ V_{RL})/8;\ and$$

$$V_{RC2L}=(3\ V_{RH}+5\ V_{RL})/8.$$

7. The A/D converter according to claim 1, wherein in the first storage operation, the first capacitor is connected between the first output or the input of the gain stage and the reference potential, and the second capacitor is connected between the second output or the input of the gain stage and the reference potential.

8. An image sensor device, comprising:
a cell array including an array of image sensor cells; and
a converter array connected to the cell array and including a plurality of A/D converters, wherein
each of the A/D converters is connected to the image sensor cells via a column line of the cell array, and
each of the A/D converters is the A/D converter according to claim 1.

9. A method of generating a digital signal from an analog signal using the A/D converter according to claim 1, comprising:
a first initial storage step of storing the analog signal from the input of the gain stage in the first capacitor, and connecting the output and the first input of the operational amplifier circuit to perform the first storage operation;
a first arithmetic step of connecting the first capacitor between the first output and the first input and performing the first arithmetic operation;
a first storage step of storing the analog signal from the input of the gain stage in the first capacitor and performing the first storage operation;
an integral A/D conversion step of repeating the first arithmetic step and the first storage step a predetermined number of times;
a second initial storage step of storing a residual analog signal as an operation value in the integral A/D conversion step in the first and second capacitors and performing the second storage operation;
a second arithmetic step of performing the second arithmetic operation;
a second storage step of storing, in the first and second capacitors, the operation value generated in the output of the gain stage in the second arithmetic step and performing the second storage operation; and
a cyclic A/D conversion step of repeating the second arithmetic step and the second storage step a predetermined number of times.

10. A method of generating a digital signal from an analog signal from an image sensor device including an array of image sensor cells by using the A/D converter according to claim 1, the image sensor cells being capable of generating a first signal which indicates a reset level, and a second signal which indicates a signal level superimposed on the reset level, the method comprising:
a first initial storage step of storing the first signal received via the input of the gain stage in the first capacitor, and connecting the output and the first input of the operational amplifier circuit to perform the first storage operation;
a first reset level arithmetic step of connecting the first capacitor between the first output and the first input and performing the first arithmetic operation;
a first reset level storage step of storing the analog signal from the input of the gain stage in the first capacitor and performing the first storage operation;
a first reset level integral A/D conversion step of repeating the first reset level arithmetic step and the first reset level storage step a predetermined number of times;
a first signal level storage step of storing a first or second standard reference voltage supplied from the first output in the first capacitor and performing the first storage operation;
a first signal level arithmetic step of connecting the first capacity between the input and the first input of the gain stage to which the second signal has been supplied and performing the first arithmetic operation;
a first signal level integral A/D conversion step of repeating the first signal level arithmetic step and the first signal level storage step a predetermined number of times;
a second initial storage step of storing, in the first and second capacitors, a residual analog signal as an operation value in the first signal level integral A/D conversion step, and performing the second storage operation;
a second arithmetic step of performing the second arithmetic operation;
a second storage step of storing, in the first and second capacitors, the operation value generated in the output of the gain stage in the second arithmetic step, and performing the second storage operation; and
a cyclic A/D conversion step of repeating the second arithmetic step and the second storage step a predetermined number of times.

11. A single-ended A/D converter, comprising:
a gain stage which includes an input for receiving an analog signal to be converted into a digital value, an output, and an operational amplifier circuit having a first input, a second input and an output;
an A/D conversion circuit which refers to a conversion reference voltage and generates a digital signal including one or more bits based on a signal from the output of the gain stage;
a logical circuit which generates a control signal according to the digital signal;
a D/A conversion circuit which has first and second outputs, and provides at least a first standard reference voltage or a second standard reference voltage to the gain stage via the first and second outputs in accordance with the control signal; and
a reference voltage generation circuit which generates the conversion reference voltage by dividing the first and second standard reference voltages, wherein
the gain stage includes first to third capacitors,
a capacity of the third capacitor is greater than capacities of the first and second capacitors,
the second input of the operational amplifier circuit receives a reference potential,
the first standard reference voltage is higher than the second standard reference voltage value,
the D/A conversion circuit includes a switch circuit for providing either the first or second standard reference voltage to the first output and providing either the first or second standard reference voltage to the second output in response to the control signal,
the A/D converter performs a first A/D conversion operation of causing the A/D conversion circuit to refer to one conversion reference voltage or the first and second conversion reference voltages and generate a 1 bit or ternary digital signal, and a second A/D conversion operation of causing the A/D conversion circuit to refer to the first and second conversion reference voltages and generate a ternary digital signal, wherein
the reference voltage generation circuit:
generates a voltage that is higher than a median between the first standard reference voltage and the second standard reference voltage value and lower than the first standard reference voltage as the first conversion reference voltage for the second A/D conversion operation, and generates a voltage that is lower than the median and higher than the second standard reference voltage as the second conversion reference voltage for the second A/D conversion operation; and
generates the median as the one conversion reference voltage for the first A/D conversion, or generates a voltage that is higher than the first conversion reference voltage for the second A/D conversion operation and lower than the first standard reference voltage as the first conversion reference voltage for the first conversion operation and generates a voltage that is lower than the second conversion reference voltage for the second A/D conversion operation and higher than the second standard reference voltage as the second conversion reference voltage for the first conversion operation; and wherein:
the third capacitor is connected between the output of the operational amplifier circuit and the first input of the operational amplifier circuit in the first A/D conversion operation and the second A/D conversion operation;
the first capacitor is connected between the one of the inputs to receive the analog signal, the first output, and the second output, and the first input or the second input; and
the second capacitor is connected between the one of the inputs to receive the analog signal, the first output, and the second output, and the first input or the second input.

* * * * *